United States Patent
Chen et al.

(10) Patent No.: US 12,040,804 B2
(45) Date of Patent: Jul. 16, 2024

(54) METHODS AND SYSTEMS FOR CONTROLLING FREQUENCY VARIATION FOR A PLL REFERENCE CLOCK

(71) Applicant: Parade Technologies, Ltd., San Jose, CA (US)

(72) Inventors: YiTing Chen, Taipei (TW); Cindy Cheng, HsinChu (TW); Hongquan Wang, Shanghai (CN); Liang Chang, Shanghai (CN); Kochung Lee, San Jose, CA (US)

(73) Assignee: PARADE TECHNOLOGIES, LTD., San Jose, CA (US)

(*) Notice: Subject to any disclaimer, the term of this patent is extended or adjusted under 35 U.S.C. 154(b) by 0 days.

(21) Appl. No.: 17/732,307

(22) Filed: Apr. 28, 2022

(65) Prior Publication Data

US 2023/0350451 A1 Nov. 2, 2023

(51) Int. Cl.

| | |
|---|---|
| *H03L 7/089* | (2006.01) |
| *G06F 1/08* | (2006.01) |
| *G06F 1/10* | (2006.01) |
| *G06F 13/42* | (2006.01) |
| *H03L 7/083* | (2006.01) |
| *H03L 7/107* | (2006.01) |

(52) U.S. Cl.
CPC .............. *H03L 7/089* (2013.01); *G06F 1/08* (2013.01); *G06F 1/10* (2013.01); *G06F 13/4291* (2013.01); *H03L 7/083* (2013.01); *H03L 7/107* (2013.01); *G06F 2213/0026* (2013.01)

(58) Field of Classification Search
CPC .......... G06F 1/08; G06F 1/10; G06F 13/4291; G06F 2213/0026
See application file for complete search history.

(56) References Cited

U.S. PATENT DOCUMENTS

| | | | | |
|---|---|---|---|---|
| 5,525,935 | A  * | 6/1996 | Joo ......................... | H04L 7/033 331/25 |
| 6,718,476 | B1 * | 4/2004 | Shima ................... | H04J 3/0688 713/400 |
| 6,980,589 | B1 * | 12/2005 | Babb ...................... | H03J 1/005 375/295 |
| 8,860,482 | B1 * | 10/2014 | Liu .......................... | H03L 7/099 327/148 |
| 9,490,824 | B1 * | 11/2016 | Singh ...................... | H03L 7/089 |

(Continued)

*Primary Examiner* — Faisal M Zaman
(74) *Attorney, Agent, or Firm* — Morgan, Lewis & Bockius LLP

(57) ABSTRACT

This application is directed to frequency controlling in an electronic device (e.g., a retimer of a data link). The electronic device includes a selector, a clock generated, and a controller. The selector selects one of a first reference signal and a second reference signal as an input signal having an input phase. The clock generator receives the input signal and generates a periodic signal with reference to the input signal, and the periodic signal has an output phase that matches the input phase of the input signal. While the first reference signal is selected as the input signal, the controller determines whether the second reference signal is in a temporal range in which the second reference signal reaches a peak frequency and controls the selector to select the second reference signal as the input signal in accordance with a determination that the second reference signal is in the temporal range.

20 Claims, 11 Drawing Sheets

(56) References Cited

U.S. PATENT DOCUMENTS

| | | | | |
|---|---|---|---|---|
| 2003/0221044 A1* | 11/2003 | Nishio | ............... | G11C 7/1078 |
| | | | | 711/4 |
| 2005/0053179 A1* | 3/2005 | Knapp | ............... | H04L 7/0004 |
| | | | | 375/354 |
| 2008/0056426 A1* | 3/2008 | Si | ..................... | H03L 7/0814 |
| | | | | 375/373 |
| 2009/0086874 A1* | 4/2009 | Wang | .................... | H04L 7/005 |
| | | | | 375/372 |
| 2012/0157031 A1* | 6/2012 | Strickland | ............ | H04B 1/1036 |
| | | | | 455/307 |
| 2013/0090762 A1* | 4/2013 | Asai | ................. | H04L 12/40013 |
| | | | | 901/8 |
| 2016/0087637 A1* | 3/2016 | Donnenwirth | ............ | H03L 7/00 |
| | | | | 331/66 |
| 2020/0336151 A1* | 10/2020 | Olumuyiwa | .............. | H03L 7/07 |
| 2021/0159789 A1* | 5/2021 | Hsu | ....................... | H02M 3/158 |
| 2022/0019257 A1* | 1/2022 | Chambers | ................ | G06F 1/06 |
| 2022/0019258 A1* | 1/2022 | Remple | ................ | G06F 1/3296 |
| 2023/0353158 A1* | 11/2023 | Wang | .................... | H03L 7/107 |

* cited by examiner

METHODS AND SYSTEMS FOR CONTROLLING FREQUENCY VARIATION FOR A PLL REFERENCE CLOCK

TECHNICAL FIELD

This application relates generally to data communication, including but not limited to, methods and systems for transferring data between two electronic devices or components using a high-speed serial expansion bus, such as a Peripheral Component Interconnect Express (PCI Express) bus.

BACKGROUND

Many electronic devices are physically coupled to each other and communicate with each other using data links and interfaces that comply with high-speed serial computer expansion bus standards (e.g., PCI Express). These bus standards allow application of retimers and redrivers to extend a channel reach at a high data speed. A redriver is an analog reach extension device designed to boost portions of a signal to counteract attenuation caused by signal propagation over a physical interconnect of a corresponding data link. A retimer is a mixed-signal device that is standard-aware and has an ability to fully recover the data, extract the embedded clock, and retransmit a fresh copy of the data using a clean clock. Compared with the redriver, the retimer actively participates in applying the bus standard to implement negotiation, timeouts, bit manipulation, jitter resetting, signal equalization, skew correction, and many other functions. The retimer functions under the control of a local crystal clock or an external reference clock, and often demonstrates unstable performance (e.g., an excessive signal overshoot) when the local crystal and external reference clocks switch between each other, thereby compromising data transferred by the corresponding data links. It would be beneficial to have a more effective frequency management mechanism in data links and interfaces using the high-speed serial computer expansion bus standards than the current practice.

SUMMARY

This application is directed to electronic devices, data links, and data interfaces that switch between two distinct clock frequencies in a controlled manner. Examples of these electronic devices, data links, and data interfaces include, but are not limited to, USB4 cables and DP 2.0 cables. These electronic devices, data links, and data interfaces comply with high-speed serial computer expansion bus standards (e.g., PCI Express). Such bus standards have substantially low tolerances (e.g., less than 400 ppm) for a frequency variation of a transmission phase-locked loop (PLL) in a retimer, particularly while a reference signal of the PLL switches from a local crystal clock to a recovery clock. Optionally, the local crystal clock is substantially stable, and the recovery clock is modulated with spread-spectrum clocking (SSC). The retimer is modified to incorporate a controller configured to identify a temporal range TR in which a reference signal reaches a peak frequency, and enable the recovery clock to initiate driving the retimer within the temporal range TR (e.g., within a frequency rising portion of the temporal range TR). By these means, retimers of the electronic devices, data links, and data interfaces switch from the local crystal clock to the recovery clock smoothly, causing no or little signal overshooting that could compromise the quality of data transmission in violation of the high-speed serial computer expansion bus standards.

In one aspect, an electronic device includes a selector, a clock generator, and a controller. The selector is configured to select one of a first reference signal and a second reference signal as an input signal having an input phase. The clock generator is coupled to the selector and configured to receive the input signal and generate a periodic signal with reference to the input signal. The periodic signal has an output phase that matches the input phase of the input signal. The controller is coupled to the selector and configured to, while the first reference signal is selected as the input signal, determine whether the second reference signal is in a temporal range TR in which the second reference signal reaches a peak frequency. The controller is also configured to in accordance with a determination that the second reference signal is in the temporal range, control the selector to select the second reference signal as the input signal. In some embodiments, the electronic device includes a data link having a retimer including a transmitter portion, a receiver portion, the selector, the clock generator, and the controller. The retimer is configured to operate in a link training mode and a data transmission mode, reconfigure the receiver or transmitter portion based on the periodic signal that is generated from the first reference signal in the link training mode, and communicate data in synchronization with the periodic signal that is generated from the second reference signal in the data transmission mode.

In some embodiments, while the first reference signal is selected as the input signal, the electronic device determines that a frequency of the second reference signal is rising towards the peak frequency during the temporal range TR. The selector is controlled by the controller to select the second reference signal in place of the first reference signal in accordance with a determination that the frequency of the second reference signal is rising towards the peak frequency in the temporal range.

In some embodiments, the first reference signal has a first frequency that is substantially stable, and the peak frequency is equal to the first frequency. Further, in some embodiments, the second reference signal has a second frequency that varies periodically between the peak frequency and a down-spreading frequency. Additionally, in some embodiments, the second frequency of the second reference signal varies with a spreading frequency corresponding to a spreading period. The controller is configured to monitor an overshoot of an output frequency of the period signal and dynamically adjust the temporal range based on the overshoot of the output frequency of the period signal. In an example, the output frequency of the periodic signal is substantially equal to 20 GHz. The first frequency of the first reference signal is substantially equal to 25 MHz. The spreading frequency is substantially equal to 30 kHz. The second frequency of the second reference signal varies, periodically with the spreading frequency, between 25 MHz and 23.75 MHz. The temporal range is less than 0.5% of the spreading period.

In another aspect, a clock generation method is implemented at an electronic device. The method includes selecting an input signal from a first reference signal and a second reference signal and generating a periodic signal with reference to the input signal. The periodic signal has an output phase that matches an input phase of the input signal. The method further includes while selecting the first reference signal as the input signal, determining whether the second reference signal is in a temporal range TR in which the second reference signal reaches a peak frequency. The method further includes in accordance with a determination that the second reference signal is in the temporal range TR, switching the input signal from the first reference signal to the second reference signal.

In yet another aspect, a method is implemented to provide an electronic device. The method includes providing a selector configured to select an input signal from a first reference signal and a second reference signal and providing a clock generator configured to generate a periodic signal with reference to the input signal. The periodic signal has an output phase that matches an input phase of the input signal. The method includes providing a controller coupled to the clock generator. The controller is configured to, while the first reference signal is selected as the input signal, determine whether the second reference signal is in a temporal range in which the second reference signal reaches a peak frequency, and in accordance with a determination that the second reference signal is in the temporal range, switch the input signal from the first reference signal to the second reference signal.

These illustrative embodiments and embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

Like reference numerals refer to corresponding parts throughout the several views of the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

An electronic device or component can be communicatively coupled to one or more other electronic devices or components by bidirectional data links that comply with a high-speed serial expansion bus standard, such as PCI Express. A retimer in such a data link uses a substantially stable local crystal clock for link training and switches to a recovery clock having a down spread spectrum for data transmission. The local crystal clock and the recovery clock have different frequencies and different phases. In various embodiments of this application, after link training, an input signal of a clock signal generator of the retimer switches from the local crystal clock to the recovery clock within a temporal range TR in which the recovery clock reaches a peak frequency $f_P$. Starting from a switching time $T_S$, a PLL of the retimer operates to generate a signal with reference to the recovery clock. In the temporal range TR, a frequency difference between the local crystal and recovery clocks is substantially small (e.g., <0.5%). Stated another way, the frequency and phase differences of the crystal clock and recovery clocks are substantially close in the temporal range TR, such that switching between the crystal clock and recovery clocks does not impact the retimer significantly. In some situations, the crystal clock is switched to the recovery clock as the recovery clock is heading to the peak frequency $f_P$ at a rising portion of the temporal range TR. After frequency switching, the PLL of the retimer tunes a loop bandwidth for an acquisition period. Upon phase locking, the PLL optionally uses different loop parameters to track SSC of the recovery clock.

Figure 1:
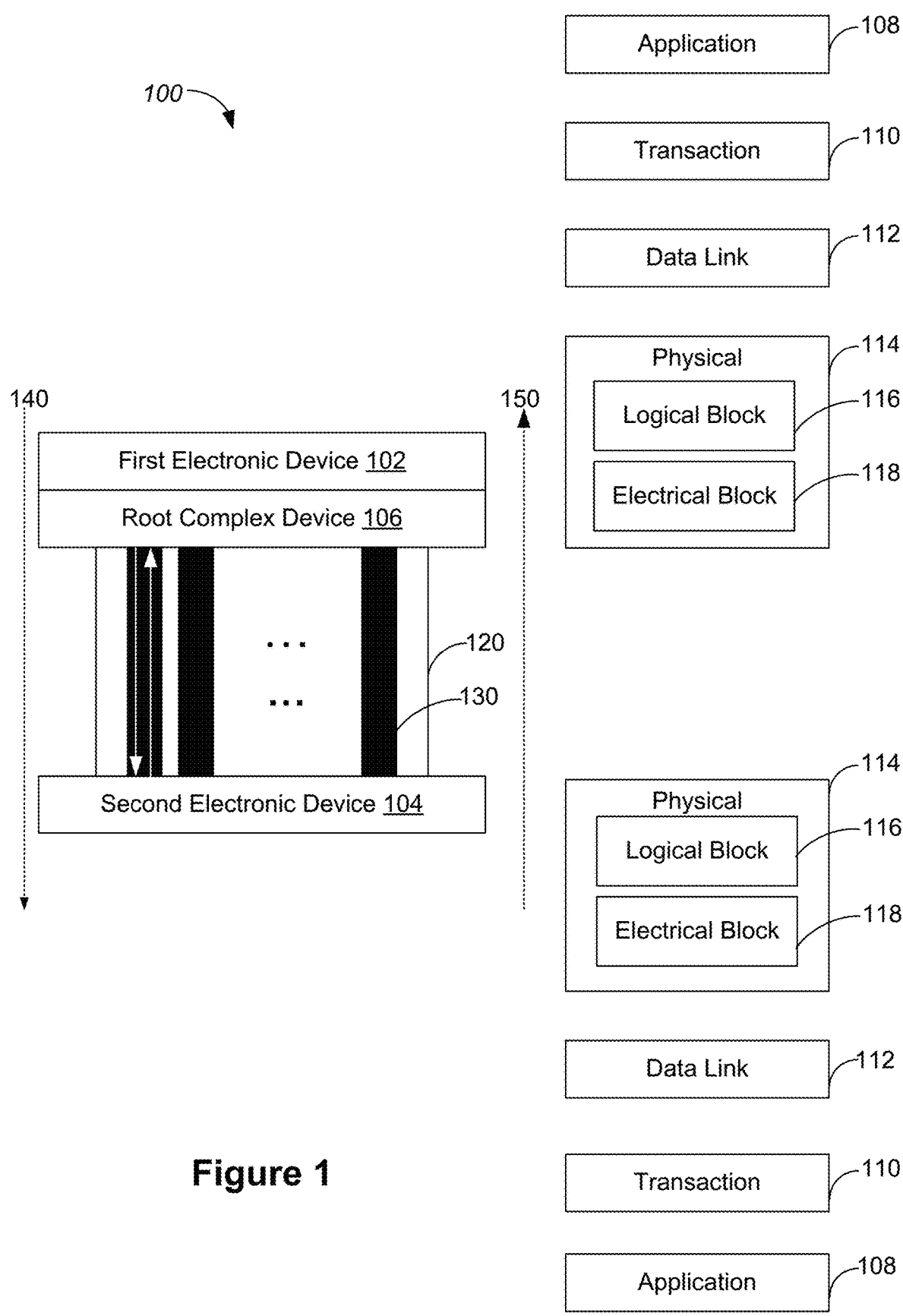
FIG. 1 is an example PCI Express electronic system in which a first electronic device or component is electrically coupled to a second electronic device or component via a data link, in accordance with some embodiments.

FIG. 1 is an example PCI Express electronic system 100 in which a first electronic device or component 102 is electrically coupled to a second electronic device or component 104 via a data link 120, in accordance with some embodiments. In an example, the first electronic device 102 includes a central processing unit (CPU) of a personal computer, and the second electronic device 104 is a peripheral component of the personal computer, such as a graphics card, a hard drive, a solid state drive, a Wi-Fi communication module, or an Ethernet card. The data link 120 includes a connection port for receiving from the second electronic device 104. The connection port is optionally formed on a mother board of the personal computer. The data link 120 complies with PCI Express (i.e., PCIe), which is a high-speed serial computer expansion bus standard, and provides an interface to communicate data packets between the first and second electronic devices 102 and 104 in compliance with the PCI Express. The data link 120 is a serial data bus including one or more data transmission lanes 130. Each lane 130 includes two wire sets for transmitting and receiving data packets, thereby supporting full-duplex communication between the first and second electronic devices 102 and 104. In some examples, the data link 120 has 1, 4, 8, or 16 lanes 130 coupled in a single data port of the data link 120. For each lane, the two wire sets correspond to a downstream data direction 140 or an upstream data direction 150 defined with respect to the first electronic device 102. Optionally, each wire set includes two wires for carrying a pair of differential signals.

In some embodiments, the first electronic device 102 includes or is coupled to a root complex device 106 that is further coupled to the data link 120. The root complex device 106 is configured to generate requests for transactions including a series of one or more packet transmissions on behalf of the first electronic device 102. Examples of the transactions include, but are not limited to, Memory Read, Memory Read Lock, IO Read, IO Write, Configuration Read, Configuration Write, and Message. In some embodiments, the first electronic device 102 is coupled to one or more additional electronic devices besides the second electronic device 104. The data link 120 includes one or more switch devices to couple the root complex device 106 of the first electronic device 102 to multiple endpoints including the second electronic device 104 and additional electronic devices not shown in FIG. 1.

PCI Express is established based on a layered model including an application layer 108, a transaction layer 110, a data link layer 112, and a physical layer 114. As the top layer, the application layer 108 is implemented in software programs, such as Ethernet, NVMe, SOP, AHCI, and SATA. In the transaction layer 110, each transaction of a series of packet transmissions is implemented as requests and responses separated by time. For example, a memory-related transaction is translated to device configuration and control data transferred to or from the second electronic device 104 (e.g., a memory device). Data packets associated with each transaction are managed by data flows on the data link layer 112. The physical layer 114 of PCI Express controls link training and electrical (analog) signaling, and includes a logical block 116 and an electrical block 118. The logic block 116 defines ordered data sets in training states (e.g., TS1 and TS2), and the electrical block 118 defines eye diagram characteristics and analog waveforms. Each layer of the layered model includes first specifications for a transmitting end where a root complex device 106 is coupled and second specifications for a receiving end where a peripheral component (i.e., the second electronic device 104) is coupled.

As high frequency signals are transmitted within the lanes 130 of the data link 120, these signals are distorted and spread over sequential symbols and result in inter symbol interferences (ISI) and bit errors at the receiving end of the second electronic device 104. These ISI and bit errors can be suppressed by a finite impulse response (FIR) driver that is coupled serially on a path of the data link 120 and configured with equalization settings using an equalization procedure. The equalization procedure is implemented when a high speed data transfer rate needs to be initialized, when an equalization request is issued from the application layer 108, or when a bit error rate (BER) exceeds a data error tolerance. A full data path is used in the equalization procedure to initialize and update the equalization settings of the FIR driver, and a bit level data path is used out of (i.e., before and after) the equalization procedure to transfer data based on the latest equalization settings that are previously initialized or updated. In some embodiments, initiation and termination of the equalization procedure are detected on the physical layer 114 based on data packets transferred over the data link 120. Control signals are generated on the physical layer 114 (i.e., not provided via the higher application or transaction layer) to enable switching between the full data path and the bit level data path.

Figure 2A:
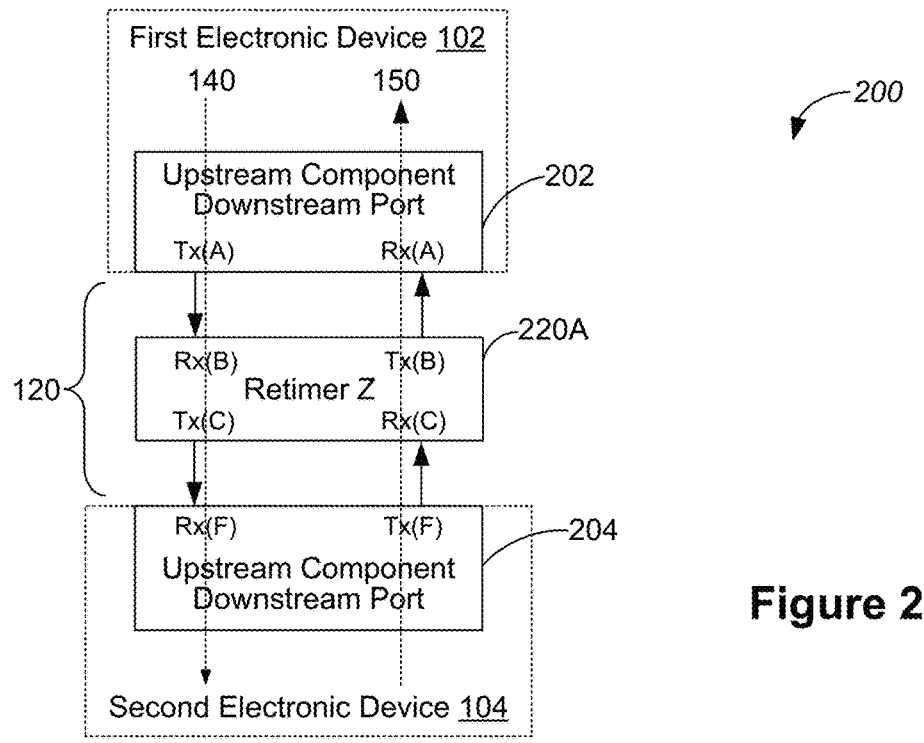
FIGS. 2A and 2B are two example electronic systems in each of which a data link is coupled between two electronic devices or components and includes at least one retimer, in accordance with some embodiments.
Figure 2B:
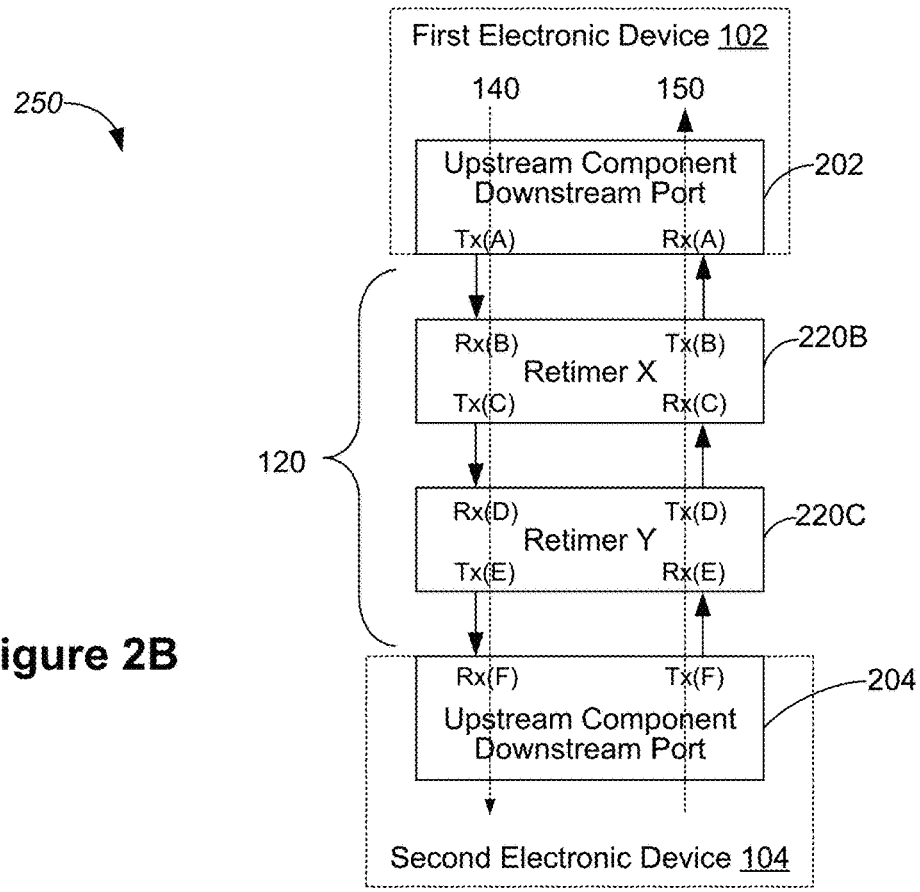
Figure 4:
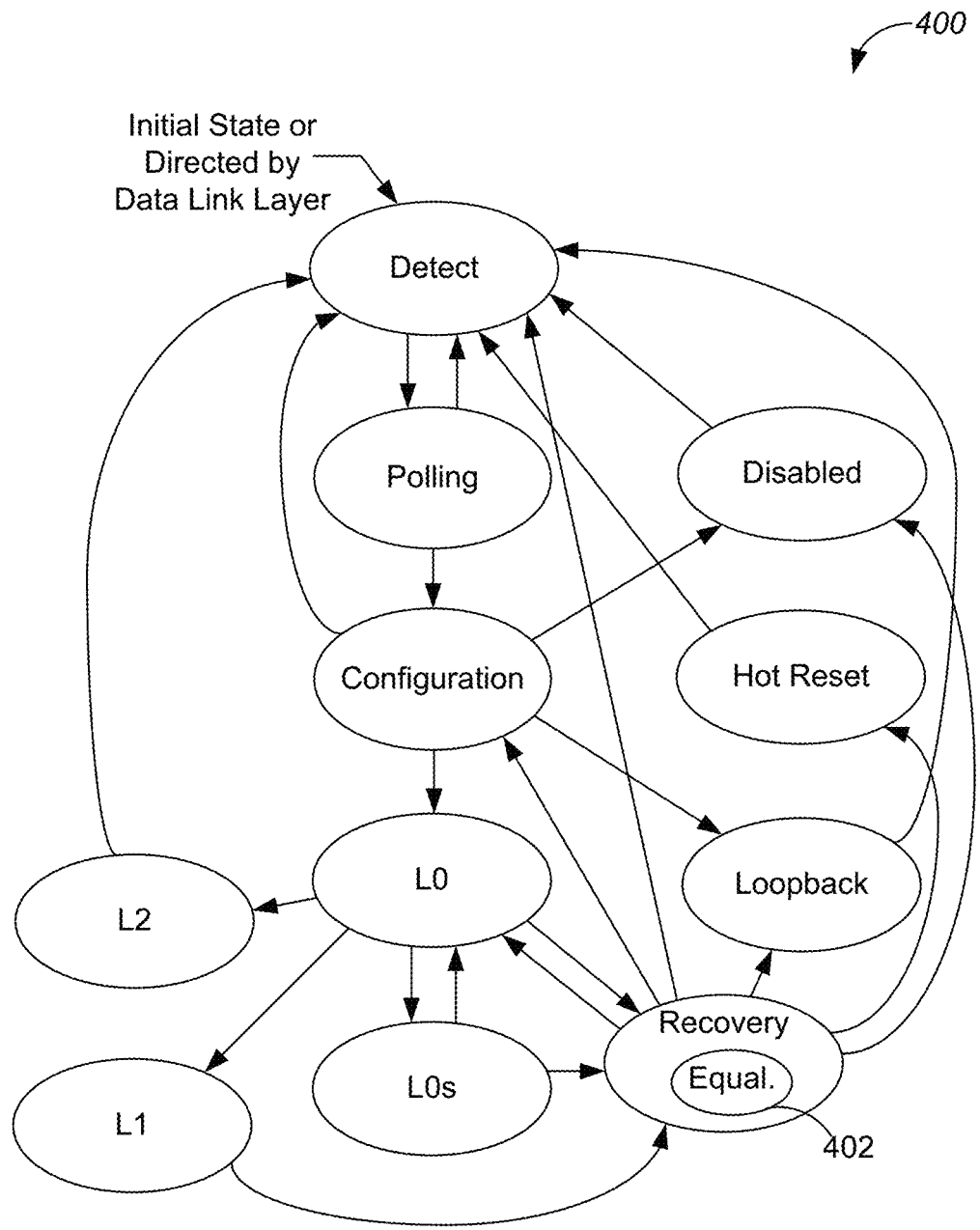
FIG. 4 is a state diagram of a Link Training and Status State Machine (LTSSM) of a data link, in accordance with some embodiments.

FIGS. 2A and 2B are two example electronic systems 200 and 250 in which a data link 120 is coupled between two electronic devices or components 102 and 104 and includes at least one retimer 220, in accordance with some embodiments. The retimer 220 is a mixed-signal device that is configured to transmit data packets actively (i.e., extract an embedded clock and recover the data packets in compliance with a bus standard, such as PCI Express). In an example, the retimer has a continuous time linear equalizer (CTLE), a wideband gain stage, and one or more of a clock and data recovery (CDR) circuit, a decision feedback equalizer (DFE), and a finite impulse response (FIR) driver. A state machine and/or a microcontroller is used in the retimer 220 to manage the CTLE, wideband gain stage, DFE, and FIR driver, and implement a link training and status state machine (LTSSM) as shown in FIG. 4.

The data link 120 enables bidirectional data communication between the electronic devices 102 and 104. A first electronic device 102 includes an upstream component 202 having a transmitting interface Tx(A) and a receiving interface Rx(A), and a second electronic device 104 includes a downstream component 204 having a receiving interface Rx(F) and a transmitting interface Tx(F). Each retimer 220 of the data link 120 is coupled between the electronic devices 102 and 104, and has a receiving interface Rx and a transmitting interface Tx for each of a downstream data direction 140 and an upstream data direction 150. Referring to FIG. 2A, the data link 120 includes only one retimer 220A. In some embodiments, the retimer 220A is disposed proximity to the upstream component 202 of the first electronic device 102 or the downstream component 204 of the second electronic device 104. A receiving interface Rx(B) and a transmitting interface Tx(B) of the retimer 220A are coupled to the transmitting interface Tx(A) and receiving interface Rx(A) of the first electronic device 102, respectively. Another transmitting interface Tx(C) and another receiving interface Rx(C) of the retimer 220A are coupled to the receiving interface Rx(F) transmitting interface Tx(F) of the second electronic device 104, respectively. As such, data packets are transmitted between the electronic devices 102 and 104, either sequentially through the interfaces Tx(A), Rx(B), Tx(C), and Rx(F) on the downstream data direction 140 or sequentially through the interfaces Tx(F), Rx(C), Tx(B), and Rx(A) on the upstream data direction 150.

Referring to FIG. 2B, the data link 120 includes two retimers 220B and 220C that are electrically coupled in series between the first and second electronic devices 102 and 104. In an example, the retimer 220B is disposed proximity to the upstream component 202 of the first electronic device 102, and the retimer 220C is disposed proximity to the downstream component 204 of the second electronic device 104. A receiving interface Rx(B) and a transmitting interface Tx(B) of the retimer 220B are coupled to the transmitting interface Tx(A) and receiving interface Rx(A) of the first electronic device 102, respectively. Another transmitting interface Tx(C) and another receiving interface Rx(C) of the retimer 220B are coupled to a receiving interface Rx(D) and a transmitting interface Tx(D) of the retimer 220C, respectively. Another transmitting interface Tx(E) and another receiving interface Rx(E) of the retimer 220C are coupled to the receiving interface Rx(F) and transmitting interface Tx(F) of the second electronic device 104, respectively. As such, data packets are transmitted between the electronic devices 102 and 104, either sequentially through the interfaces Tx(A), Rx(B), Tx(C), Rx(D), Tx(E), and Rx(F) on the downstream data direction 140 or sequentially through the interfaces Tx(F), Rx(E), Tx(D), Rx(C), Tx(B), and Rx(A) on the upstream data direction 150.

Figure 3A:
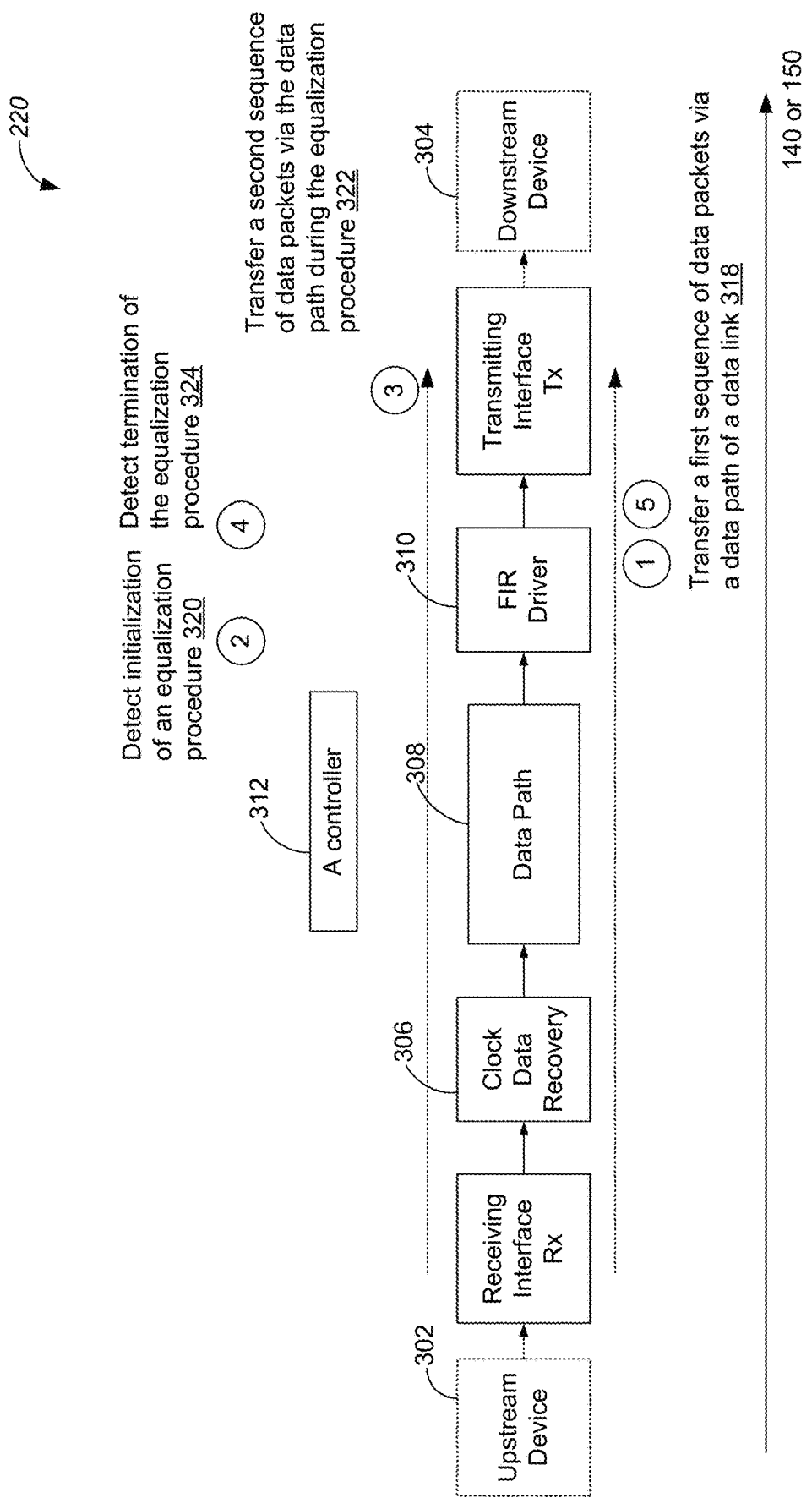
FIG. 3A is a simplified block diagram of an example retimer of a data link 120 that transfers data on a downstream or upstream data direction, in accordance with some embodiments.

FIG. 3A is a simplified block diagram of an example retimer 220 of a data link 120 that transfers data on a downstream or upstream data direction 140 or 150, in accordance with some embodiments. The retimer 220 includes a receiving interface Rx, clock and data recovery circuit 306, data path 308, FIR driver 310, and a transmitting interface Tx. The retimer 220 is configured to recover and amplify signals received at the receiving interface Rx corresponding to the downstream or upstream data direction 140 or 150, thereby extending a channel reach of the data link 120. Specifically, the receiving interface Rx receives data packets from an upstream device 302. The data packets optionally include link training data, transaction requests, or transaction responses. The clock and data recovery circuit 306 recovers an embedded clock signal (also called a recovery clock) and data from the data packets. The data path 308 processes the recovered data under the control of the embedded clock signal, and output the processed data to be fed into the FIR driver 310. An output of the FIR driver 310 is provided to the transmitting interface Tx and a downstream device 304.

Referring to FIG. 2A, on the downstream data direction 140, the upstream and downstream devices 302 and 304 of the retimer 220A are the first electronic device 102 and the second electronic device 104, respectively. On the upstream data direction 150, the upstream and downstream devices 302 and 304 of the retimer 220A are the second electronic device 104 and the first electronic device 102, respectively. Referring to FIG. 2B, on the downstream data direction 140, the upstream and downstream devices 302 and 304 of the retimer 220B are the first electronic device 102 and the retimer 220C, respectively, and the upstream and downstream devices 302 and 304 of the retimer 220C are the retimer 220B and the second electronic device 104, respectively. On the upstream data direction 150, the upstream and downstream devices 302 and 304 of the retimer 220C are the second electronic device 104 and the retimer 220B, respectively, and the upstream and downstream devices 302 and 304 of the retimer 220B are the retimer 220C and the first electronic device 102.

Referring to FIG. 3A, the FIR driver 310 is configured to improve signal quality of the data packets via digital signal conditioning (e.g., via high frequency filtering in a digital domain), and has a plurality of equalization settings (e.g., filtering coefficients). A default coefficient preset or a previously determined set of filtering coefficients is applied to transmit data packets upon initiation of a data transmission process, and updated with another preset or new set of filtering coefficients during link training. To update the coefficients of the FIR driver 310, protocol-aware equalization negotiation is implemented between the upstream device 302 and the downstream device 304. For example, referring to FIG. 2A, the retimer 220A is engaged in protocol-aware equalization negotiation between the upstream component 202 and the downstream component 204. Likewise, referring to FIG. 2B, the retimer 220B is engaged in protocol-aware equalization negotiation between the upstream component 202 and the retimer 220C, and the retimer 220C is engaged in protocol-aware equalization negotiation between the retimer 220B and the downstream component 204.

Stated another way, the retimer 220 is configured to execute an equalization procedure to use the negotiation between the upstream device 302 and the downstream device 304 to update the coefficients of the FIR driver 310. In some embodiments, this equalization procedure complies with an electronic device bus standard, e.g., PCI Express 3.0 or above. A local crystal clock has a substantially stable frequency (e.g., having a variation within ±0.01%) is applied during the equalization procedure that determines the coefficients of the FIR driver 310. For example, the negotiation and equalization procedure continues till a predefined equalization criterion is satisfied (e.g., till a bit error rate received at the downstream device 304 is less than a data error tolerance). When the equalization procedure is terminated, the retimer 220 switches to the recovery clock extracted from incoming data and uses the FIR driver 310 that operate with the updated coefficients to forward the data packets received from the upstream device 302 to the downstream device 304. As such, in an example, the clock data recovery circuit 306 is enabled to use the local crystal clock to set up the FIR driver 310 in the equalization procedure, when a high speed data transmission associated with PCI Express 3.0 or above is requested and needs to be initiated, and extract the recovery clock to operate with the FIR driver 310 that has been set up in the equalization procedure, during the subsequent high speed data transmission associated with PCI Express 3.0 or above (e.g., in a fully active state L0 in FIG. 4).

Specifically, before the equalization procedure is initiated, a first sequence of data items is received from the upstream device 302, and transferred (318) via the data path 308 of the data link 120 to the downstream device 304. The FIR driver 310 adopts the default coefficient preset or a previously determined set of filtering coefficients during the course of processing the first sequence of data items, which may result in a relatively high bit error rate (e.g., $10^{-5}$). The stream of data items includes an initiation data packet indicating initiation of the equalization procedure. A controller 312 detects (320) the initialization of the equalization procedure based on the initiation data packet in the first sequence of data packets. In accordance with detection of the initiation of the equalization procedure, the retimer 220 selects a local crystal clock as a reference to generate a periodic signal. During the equalization procedure, a second sequence of data packets immediately follows the first sequence of data packets, and is transferred (322) from the upstream device 302 to the downstream device 304 via the data path 308 of the data link 120. The equalization procedure updates filtering coefficients of the FIR driver 310 based on protocol-aware equalization negotiation between the upstream and downstream components 202 and 204 (FIG. 2A) or among the upstream component 202, retimers 220B and 202C, and downstream component 204 (FIG. 2B). In some embodiments, the filtering coefficients of the FIR driver 310 are finalized and the equalization procedure can be terminated, when the bit error rates are suppressed to be less than the bit error tolerance (e.g., $10^{-12}$) at each of the receiving interfaces Tx of the upstream component 202, retimer(s) 220, and downstream component 204. The second sequence of data packets is ended with a termination data packet indicating termination of the equalization procedure. In some embodiments, the controller 312 detects (324) termination of the equalization procedure based on the termination data packet in the second sequence of data packets. The recovery clock is re-selected to transfer one or more subsequent sequences of data packets in collaboration with the FIR driver 310 using the updated filtering coefficients.

Figure 3B:
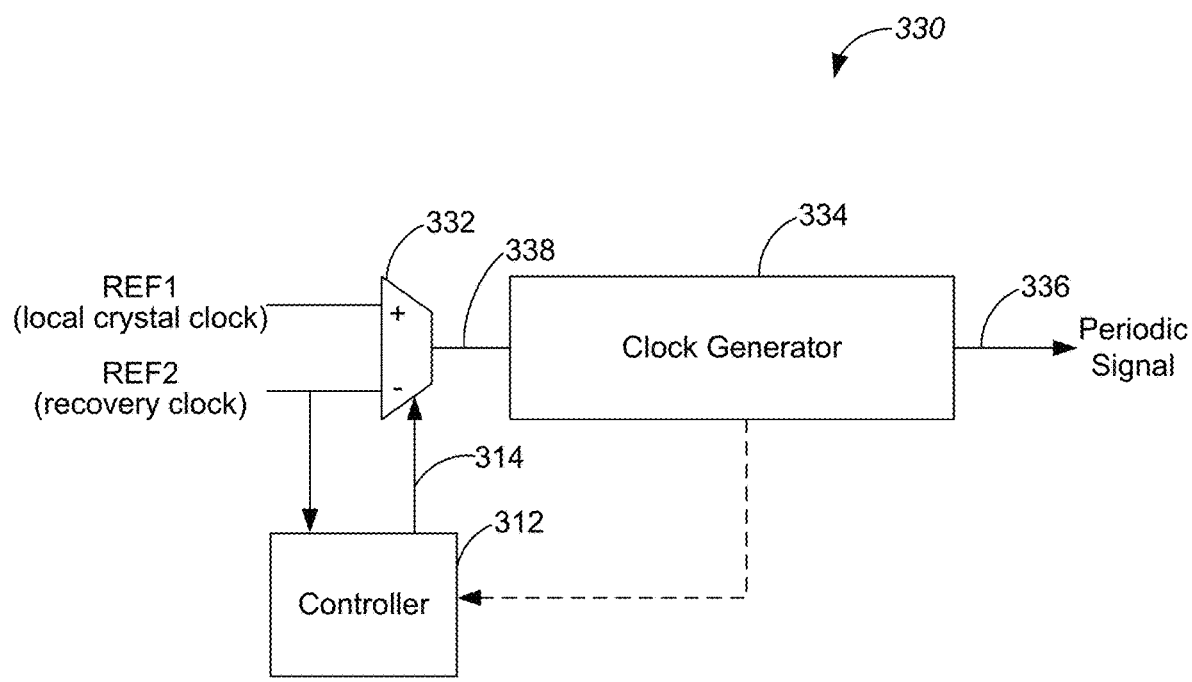
FIG. 3B is a block diagram of an example clock control circuit 330 of a retimer, in accordance with some embodiments.

FIG. 3B is a block diagram of an example clock control circuit 330 of a retimer 220, in accordance with some embodiments. The clock control circuit 330 includes a selector 332, a clock generator 334, and the controller 312. The clock control circuit 330 receives a first reference signal REF1 (e.g., a local crystal clock) and a second reference signal REF2 (e.g., a recovery clock), and generates a periodic signal 336 based on an input signal 338. The first reference signal REF1 has a first frequency that is substantially stable (e.g., varies less than 0.5% of the first frequency). The second reference signal REF2 has a second frequency that peaks at a peak frequency $f_P$ equal to the first frequency. The second frequency changes between the peak frequency $f_P$ and a down-spreading frequency (e.g., 95% of the peak frequency $f_P$). This input signal 338 switches between the first and second reference signals REF1 and REF2, e.g., in accordance with a determination that equalization or data transmission is executed on the retimer 220. During an equalization procedure, the first reference signal REF1 (e.g., the local crystal clock) is selected as the input signal 338 to generate the periodic signal 336. During data transmission, the second reference signal REF2 (e.g., the recovery clock) is selected as the input signal 338 to generate the periodic signal 336. The recovery clock is optionally recovered from incoming data packets received from an upstream device 302 by the clock and data recovery circuit 306.

The selector 332 is configured to receive a lock signal CK_SW 314 from the controller 312, and select one of the first reference signal REF1 and the second reference signal REF2 as the input signal 338 having an input phase under the control of the controller 312. The clock generator 334 is coupled to the selector 332, and configured to receive the input signal 338 and generate the periodic signal 336 with reference to the input signal 338. The periodic signal 336 has an output phase that matches the input phase of the input signal 338. The controller 312 is coupled to the selector 332 and configured to while the first reference signal REF1 is selected as the input signal 338, e.g., during an equalization procedure, determine whether the second reference signal REF2 is in a temporal range in which the second reference signal REF2 reaches a peak frequency $f_P$. The controller 312 is configured to control the selector 332 to select the second reference signal REF2 as the input signal 338 in accordance with a determination that the second reference signal REF2 is in the temporal range TR. In an example, the controller 312 is implemented based on a clock switch state machine.

In some embodiments, the retimer 220 is configured to operate at a link training mode and a data transmission mode. In the link training mode, the retimer 220 reconfigures a receiver or transmitter portion (e.g., including a FIR driver 310) based on the periodic signal 336 that is generated from the first reference signal REF1. In the data transmission mode, the retimer 220 communicates data packets received from the upstream device 302 in synchronization with the periodic signal 336 that is generated from the second reference signal REF2.

FIG. 4 is a state diagram of a Link Training and Status State Machine (LTSSM) 400 of a data link 120, in accordance with some embodiments. The LTSSM 400 has five categories of states: link training states (e.g., Detect, Polling, and Configuration), a link re-training state (e.g., Recovery), power management states (e.g., L0, L1, and L2), active power management states (e.g., L0s and L1), and other states (e.g., Disabled, Loopback, Hot Reset). Each state further includes one or more substates. After any type of Reset exit or upon a request from a data link layer 112, the data link 120 goes through the Detect, Polling, and Configuration states sequentially and reaches the fully active state (L0) in which normal data transmission is implemented.

In some embodiments, if a BER exceeds a data error tolerance in the fully active state (L0), the LTSSM 400 transitions to the Recovery state in which the data link is retrained to update settings of the FIR driver 310 via an equalization procedure 402. The first reference signal REF1 (e.g., a local crystal clock) is selected upon initiation of the equalization procedure 402, and deselected upon termination of the equalization procedure 402 (e.g., when the data link 120 returns to normal operation in the fully active state (L0)).

In some embodiments, the data link 120 is a PCI Express 3.0 or above link, and an equalization procedure is performed when a data rate is increased. Each data lane 130 is configured to transmit data at different data rates including a first data rate (e.g., 0.5 Gbps) and a second data rate (e.g., 1 Gbps) that is higher than the first data rate. The data link 120 goes through the Detect, Polling, and Configuration states sequentially and reaches the fully active state (L0). In the fully active state (L0), data packets are transferred at the first data rate. In response to a request to boost up a data rate of the data link 120 to the second data rate, the data link 120 enters the Recovery state in which an equalization procedure 402 is implemented to determine equalization settings of the FIR driver 310 that can support the second data rate. The first reference signal REF1 (e.g., a local crystal clock) is selected upon initiation of the equalization procedure 402, and deselected upon termination of the equalization procedure 402 (e.g., when the equalization settings of the FIR driver 310 support the second data rate and the data link 120 returns to the fully active state (L0)). When the data link 120 returns to the fully active state (L0), a second reference signal REF2 (e.g., recovery clock) is selected, and data packets start to be transferred at the second data rate via the data path 308 of the data link 120. As such, the equalization procedure is performed at least when the BER exceeds a data error tolerance and when the data rate of the data link is increased to a higher level.

Figure 5:
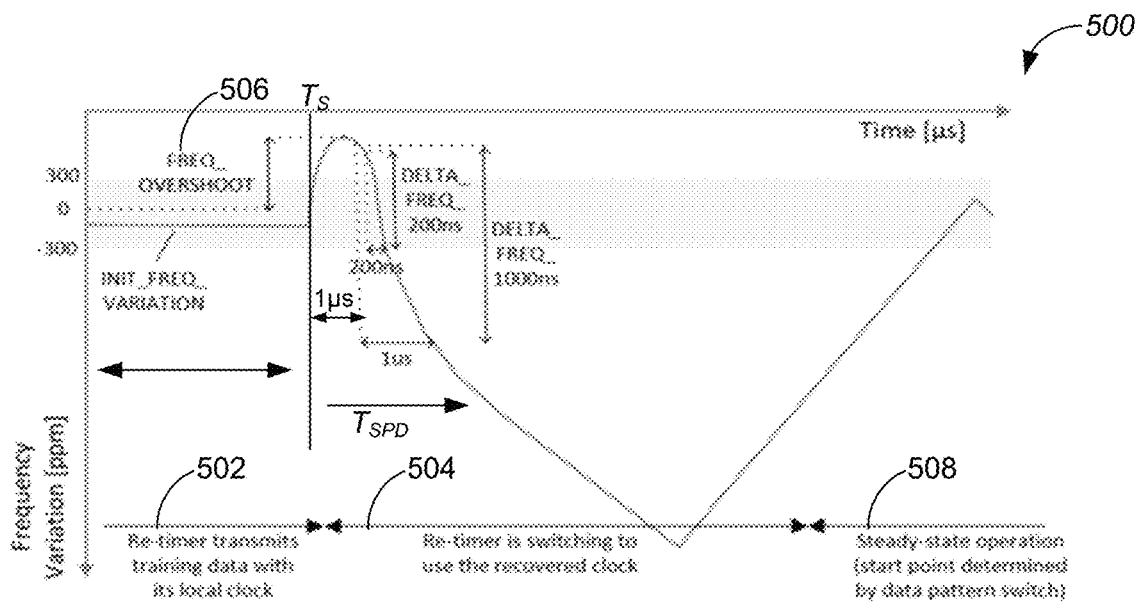
FIG. 5 is a temporal diagram of an example frequency variation of a periodic signal generated by the clock generator 334 during link training, in accordance with some embodiments.

FIG. 5 is a temporal diagram of an example frequency variation 500 of a periodic signal 336 generated by the clock generator 334 during link training, in accordance with some embodiments. At a switching time $T_S$, the retimer 220 switches from a link training mode to a data transmission mode. Prior to the switching time $T_S$, the clock control circuit 330 of the retimer 220 selects a first reference signal REF1 (e.g., a local crystal clock generated from a local oscillation crystal of the retimer 220) and transmits training data based on the first reference signal REF1. The first reference signal REF1 is substantially stable (e.g., within ±300 ppm of a first frequency). It is noted that the first reference REF1 is distinct from a data rate of the retimer 220. For example, the first frequency of the first reference signal REF1 and the data rate are 25 MHz and 20 GHz, respectively.

After the switching time $T_S$ and in the data transmission mode (504), the clock control circuit 330 of the retimer 220 selects a second reference signal REF2 (e.g., a recovery clock extracted from incoming data) and transmits the data based on the second reference signal REF2. The second reference signal REF2 varies periodically between a peak frequency $f_P$ equal to the first frequency and a down-spreading frequency. A second frequency of the second reference signal REF2 varies with a spreading frequency $f_{SPD}$ corresponding to a spreading period $T_{SPD}$. In prior art, the periodic signal 336 does not track the second reference signal REF2 closely. In an example, the periodic signal 336 has a frequency overshoot 506 immediately following the switching time $T_S$, and the frequency overshoot 506 is beyond ±300 ppm of an output frequency of the periodic signal 336 within a short duration of time of 1 µs. The frequency overshoot 506 settles and varies periodically after an extended duration of time of 2 µs, and the retimer 220 enters a steady-state operation 508. In some embodiments, the retimer 220 determines a start point of the steady-state operation 508 based on a data pattern switch. However, the frequency overshoot 506 does not comply with high-speed serial computer expansion bus standards and has to be reduced using frequency controlling techniques as disclosed in this application.

Figure 6:
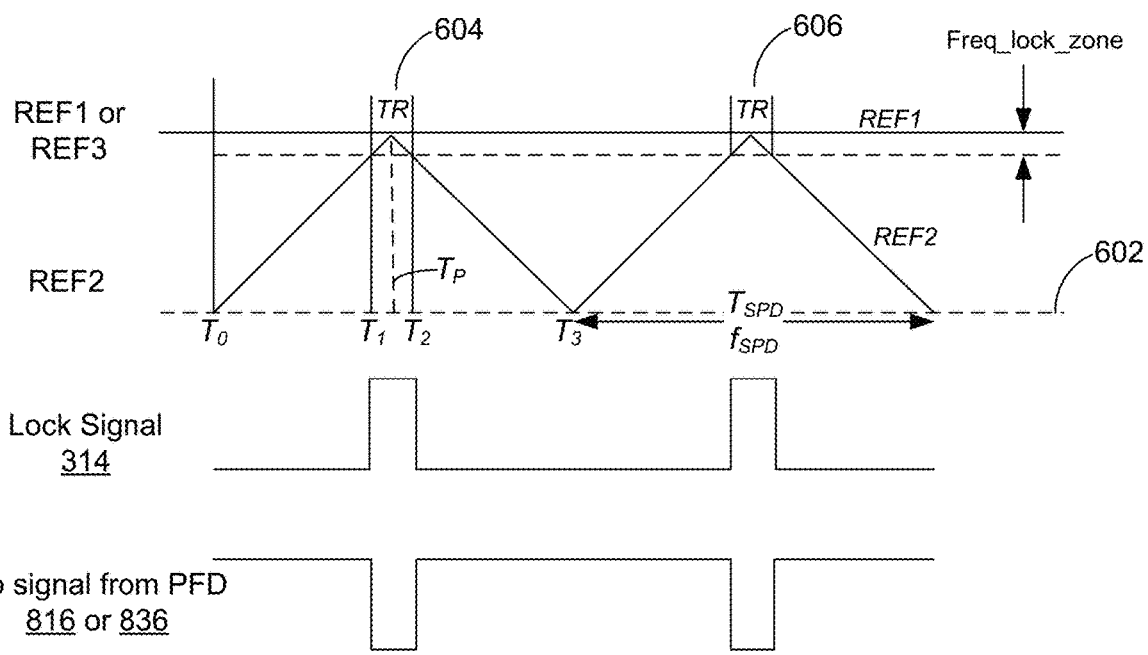
FIG. 6 is a temporal diagram of two example reference signals REF1 and REF2 that are switched in a temporal range TR (i.e., a clock switch zone), in accordance with some embodiments.

FIG. 6 is a temporal diagram of two example reference signals REF1 and REF2 that are switched in a temporal range TR (i.e., a clock switch zone), in accordance with some embodiments. As explained above, the first reference signal REF1 is substantially stable (e.g., within ±30 ppm or ±300 ppm of a first frequency). An example of the first frequency is 25 MHz. The second reference signal REF2 varies periodically between a peak frequency $f_P$ equal to the first frequency and a down-spreading frequency 602. A second frequency of the second reference signal REF2 varies with a spreading frequency $f_{SPD}$ corresponding to a spreading period $T_{SPD}$. In an example, the first frequency of the first reference signal REF1 is substantially equal to 25 MHz. The spreading frequency $f_{SPD}$ is substantially equal to 30 kHz, and the second frequency of the second reference signal REF2 varies, periodically with the spreading frequency $f_{SPD}$, between 25 MHz and 23.75 MHz. An output frequency of a periodic signal generated from the reference signal REF1 or REF2 is substantially equal to 20 GHz, and configured to determine a data transmission rate of the corresponding data link 102. The temporal range TR is less than 0.5% of the spreading period $T_{SPD}$. Specifically, the spreading period $T_{SPD}$ is 30-33 µs, and the temporal range TR is 0.15-0.165 µs.

During an equalization procedure in a link training mode, the first reference signal REF1 is selected as the input signal 338. A controller 312 determines whether the second reference signal REF2 is in the temporal range TR in which the second reference signal REF2 reaches the peak frequency $f_P$ (i.e., a maximum value of a second frequency of the second reference signal REF2). In accordance with a determination that the second reference signal REF2 is in the temporal range TR, the controller 312 controls the selector 332 to select the second reference signal REF2 as the input signal 338. In some embodiments, the controller 312 is configured to monitor an overshoot 506 of an output frequency of a period signal 336 and dynamically adjust the temporal range TR based on the overshoot 506 of the output frequency of the period signal 336. Specifically, in an example, the controller 312 determines that the overshoot 506 of the output frequency of the period signal 336 exceeds a predefined overshoot tolerance (e.g., 300 ppm) and reduces the temporal range TR to control the overshoot 506 within the predefined overshoot tolerance.

In the temporal range TR, a second frequency of the second reference signal RFE2 increases to the peak frequency $f_P$ and decreases from the peak frequency $f_P$. While the first reference signal REF1 is selected as the input signal 338, the controller 312 determines that the frequency of the second reference signal REF2 is rising towards the peak frequency $f_P$ during the temporal range TR. The selector 332 is controlled by the controller 312 to select the second reference signal REF2 in place of the first reference signal REF1 in accordance with a determination that the frequency of the second reference signal REF2 is rising towards the peak frequency $f_P$ in the temporal range TR.

In some embodiments, data are transmitted via the retimer 220 after the second reference signal REF2 is selected until a system reset signal is enabled. The controller 312 is configured to receive a system reset signal and determine whether the system reset signal is enabled while the first reference signal REF1 is being selected as the input signal 338. The selector 332 is controlled by the controller 312 to select the second reference signal REF2 in place of the first reference signal REF1 in accordance with a determination that the system reset signal is disabled and a determination that the second reference signal REF2 is in the temporal range TR. Additionally, in some situations, the selector 332 is controlled by the controller 312 to, while the second reference signal REF2 is selected as the input signal 338, select the first reference signal REF1 in accordance with a determination that the system reset signal is enabled.

Figure 7:
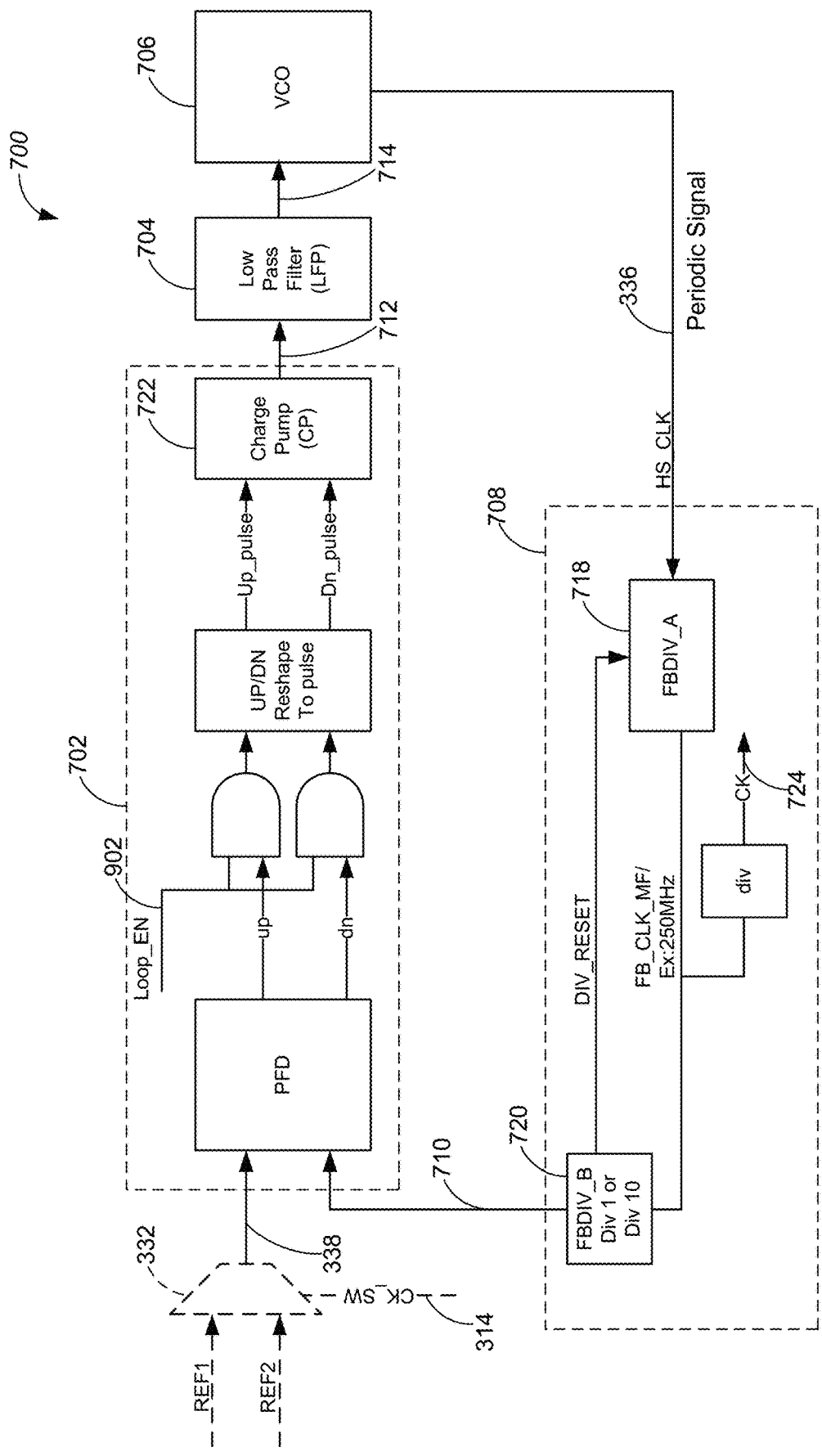
FIG. 7 is a block diagram of an example PLL that generates a periodic signal with reference to two selectable reference signals REF1 and REF2, in accordance with some embodiments.

FIG. 7 is a block diagram of an example PLL 700 that generates a periodic signal 336 with reference to two selectable reference signals REF1 and REF2, in accordance with some embodiments. The clock generator 334 is implemented using the PLL 700, and the PLL 700 is coupled to the selector 332 to select one of the reference signals REF1 and REF2 as the input signal 338. The PLL 700 further includes a PLL frequency or phase comparator 702, a loop filter 704, a voltage controlled oscillator (VCO) 706, and a feedback path 708. The PLL frequency or phase comparator 702 is configured to receive the input signal 338 and a feedback clock 710 and generate a PLL comparison signal 712. The loop filter 704 is coupled to the PLL frequency or phase comparator 702, and configured to generate a DC difference voltage 714 based on the PLL comparison signal 712. Optionally, a magnitude of the DC difference voltage 714 depends on a difference of frequencies of the input signal 338 and feedback clock 710. Optionally, the magnitude of the DC difference voltage 714 depends on a difference of phases of the input signal 338 and feedback clock 710. The VCO 706 is coupled to the loop filter 704, and configured to generate the periodic signal 336 based on the DC difference voltage 714.

The feedback path 708 is coupled to the VCO 706 and PLL frequency or phase comparator 702, forming a negative feedback loop in which the feedback path 708 converts the periodic signal 336 to the feedback clock 710 and feeds the feedback clock 710 to the PLL frequency or phase comparator 702. In some embodiments, as the difference of the frequencies of the input signal 338 and feedback clock 710 increases, the DC difference voltage 714 increases to compensate the difference, thereby driving the frequency of the feedback clock 710 towards the frequency of the input signal 338. In some embodiments, as the difference of the phases of the input signal 338 and feedback clock 710 increases, the DC difference voltage 714 increases to compensate the difference, thereby driving the phase of the feedback clock 710 towards the phase of the input signal 338.

In some embodiments, an output frequency of the periodic signal 336 is greater than, and equal to an integer multiple of, an input frequency of the input signal 338. For example, the output frequency of the periodic signal 336 is substantially equal to 20 GHz, and the first frequency of the selected first reference signal REF1 is substantially equal to 25 MHz. The feedback path 708 includes a first feedback divider 718 and a second feedback divider 720 coupled in series with the first feedback divider 718. The first feedback divider 718 is configured to scale down the output frequency of the periodic signal 336 by a first integer multiple, and the second feedback divider 720 is configured to scale down the output frequency of the periodic signal 336 further by a second integer multiple. In an example, the first and second integer multiples are equal to 80 and 10. The first feedback divider 718 reduces the output frequency of 20 GHz to 250 MHz, and the second feedback divider 720 further reduces the frequency of 250 MHz to 25 MHz.

Additionally, in some embodiments, the PLL frequency or phase comparator 702 further includes a charge pump circuit 722 coupled to the loop filter 704. The charge pump 722 is configured to control a variation rate of the DC difference voltage 714. In response to the input signal 338 being switched from the first reference signal REF1 to the second reference signal REF2. An overshoot 506 on an output frequency of the periodic signal 336 is controlled to be less than a predefined portion of the output frequency of the periodic signal 336 (e.g., 300 ppm).

Referring to FIG. 7, in a link training mode, an equalization procedure is implemented to determine device configurations of a corresponding data direction 140 or 150. The first reference signal REF1 is provided by a local oscillation crystal embedded in a retimer 220, and selected to act as the input signal 338 in the link training mode. Conversely, as the link training mode switches to a data transmission mode, e.g., at a switching time $T_S$, the second reference signal REF2 is selected to act as the input signal 338. In some embodiments the second reference signal REF2 is a recovery clock recovered from incoming data received by the retimer 220, and the recovery clock is modulated with spread-spectrum clocking. The second reference signal REF2 has a second frequency that varies periodically between the peak frequency $f_P$ and a down-spreading frequency 602 lower than the peak frequency $f_P$.

Figure 8A:
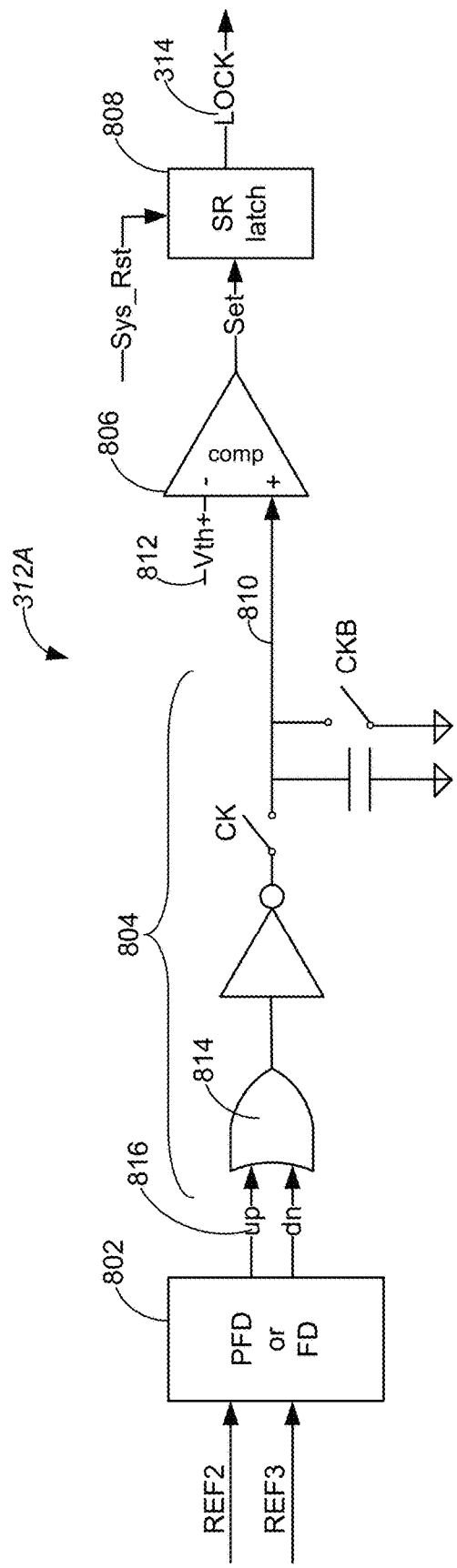
FIGS. 8A and 8B are block diagrams of example controllers that generate lock signals for selecting a reference signal REF1 or REF2 in a PL, in accordance with some embodiments.
Figure 8B:
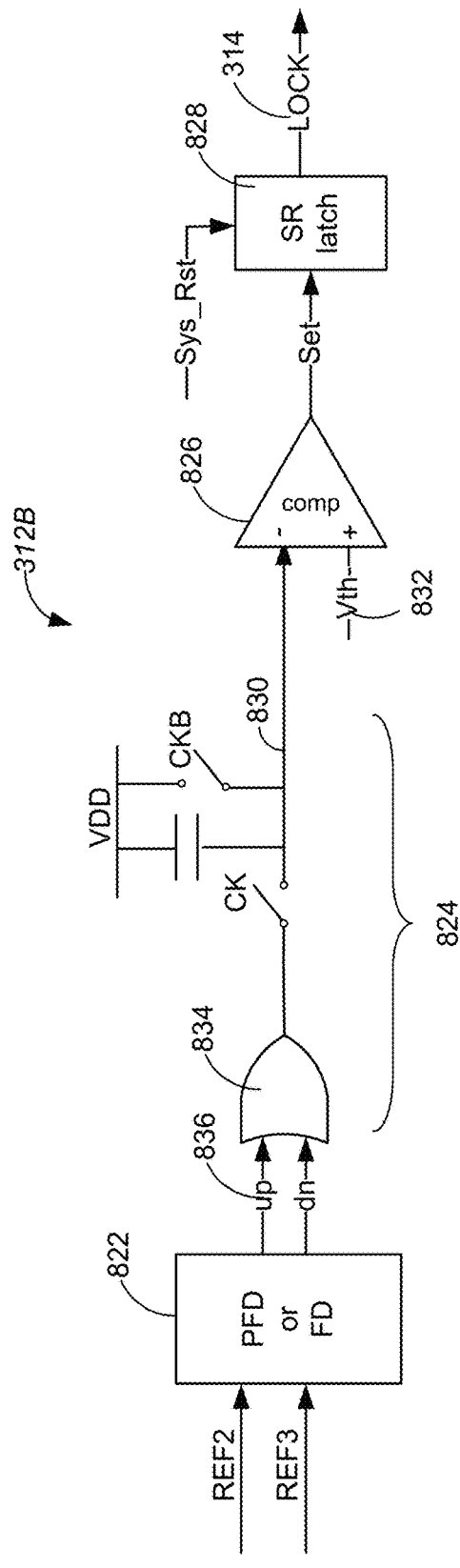

FIGS. 8A and 8B are block diagrams of example controllers 312 that generate lock signals 314 for selecting a reference signal REF1 or REF2 in a PLL 700, in accordance with some embodiments. Referring to FIG. 8A, in some embodiments, a retimer 220 operates in a link training mode. The controller 312A includes a frequency or phase difference detector 802 (also called a phase frequency detector (PFD)), an integrator 804, a comparator 806, and a lock latch 808. The frequency or phase difference detector 802 is configured to detect a frequency or phase difference between the second reference signal REF2 and a third reference signal REF3 (e.g., the feedback clock 710 in FIG. 7). The integrator 804 is coupled to the frequency or phase difference detector 802 and configured to generate a lock voltage 810 that increases in response to detection of the frequency or phase difference of the second and third reference signals REF2 and REF3. The comparator 806 is coupled to the integrator 804 and configured to compare the lock voltage 810 with a lock threshold 812 associated with the temporal range TR. The lock latch 808 is coupled to the comparator 806 and configured to in accordance with a determination that the lock voltage 810 exceeds the lock threshold 812, enable a lock signal 314 for controlling the selector 332 to select the second reference signal REF2 as the input signal 338.

Referring to FIG. 6, starting from an initial time $T_0$, an up signal 816 generated by the frequency or phase difference detector 802 is high, and the lock signal 314 outputted by the controller 312 is low, such that the first reference signal REF1 is still selected as the input signal 338 to implement the equalization procedure. The temporal range TR is defined as a range in which the second reference signal REF2 reaches a first frequency $f_P$-$\Delta$, rises to a peak frequency $f_P$, and returns to the first frequency $f_P$-$\Delta$. The lock voltage 810 generated by the integrator 804 increases from the down spreading frequency 602 and hits the lock threshold 812 in the temporal range TR, when or after a second frequency of the second reference signal REF2 reaches the first frequency $f_P$-$\Delta$ at a first time $T_1$. In some embodiments, the input signal 338 is switched to the second reference signal REF2 during either a frequency rising portion or a frequency falling portion of the temporal range TR. In some embodiments, the input signal 338 is switched to the second reference signal REF2 only during a frequency rising portion in the time range TR.

In some situations, the initial time $T_0$ corresponds to a system reset signal that is enabled in the link training mode and disabled in the data communication mode of the retimer 220. After the system reset signal is disabled at the initial time $T_0$, the input signal 338 switches from the first reference signal REF1 to the second reference signal REF2 in a first temporal rang TR 604 following the initial time $T_0$ or a subsequent temporal range TR 606 following the first temporal range TR 604.

Additionally, in some embodiments, after the input signal 338 switches to the second reference signal REF2 in one of the temporal ranges TR, the input signal 338 operates with spread-spectrum clocking as the second reference signal REF2, so is the periodic signal 336 outputted by the clock generator 334 (e.g., PLL 700). In the data communication mode, in accordance with a determination that the system reset signal is enabled, the selector 332 is controlled by the controller 312 to select the first reference signal REF1 in place of the second reference signal REF2, and the retimer 220 switches to the link training mode in which the equalization procedure is performed on the retimer 220.

Referring to FIG. 8B, in some embodiments, the controller 312B includes a frequency or phase difference detector 822, an integrator 824, a comparator 826, and a lock latch 828. The frequency or phase difference detector 822 is configured to detect a frequency or phase difference between the second reference signal REF2 and a third reference signal REF3 (e.g., the feedback clock 710 in FIG. 7). The integrator 824 is coupled to the frequency or phase difference detector 822 and configured to generate a lock voltage 830 that drops from a voltage rail (e.g., a high supply voltage VDD) in response to detection of the frequency or phase difference of the second and third reference signals REF2 and REF3. The comparator 826 is coupled to the integrator 804 and configured to compare the lock voltage 830 with a lock threshold 832 associated with the temporal range TR. The lock latch 808 is coupled to the comparator 826 and configured to, in accordance with a determination that the lock voltage 810 drops below the lock threshold 812, enable a lock signal 314 for controlling the selector 332 to select the second reference signal REF2 as the input signal 338.

In some embodiments, the frequency or phase difference detector 802 or 822 includes a frequency difference detector configured to detect a frequency difference between the second and third frequency signals REF2 and REF3, and the integrator includes an OR logic 814 or 834 coupled to the frequency difference detector 802 or 822 to enable integration within the integrator 804 or 824, respectively. Alternatively, in some embodiments, the integrator 804 or 824 includes an NAND logic used to implement the OR logic 814 or 834, respectively.

In some embodiments, the frequency or phase difference detector 802 or 822 includes a phase difference detector configured to detect a phase difference between the second and third frequency signals REF2 and REF3, and the integrator 804 or 824 includes an OR logic coupled to the phase difference detector 802 to enable integration within the integrator 804 or 824. In some embodiments, the clock generator 334 (e.g., PLL 700) is further configured to divide the periodic signal 336 to generate the third reference signal REF3 (e.g., the feedback clock 710, a reference clock 724), and the controller 312 is configured to receive the third reference signal REF3 from the clock generator 334. In some embodiments, the controller 312 is configured to monitor an overshoot 506 of an output frequency of the periodic signal 336 and dynamically adjust the lock threshold 812 or 832 based on the overshoot 506 of the output frequency of the periodic signal 336.

Figure 9:
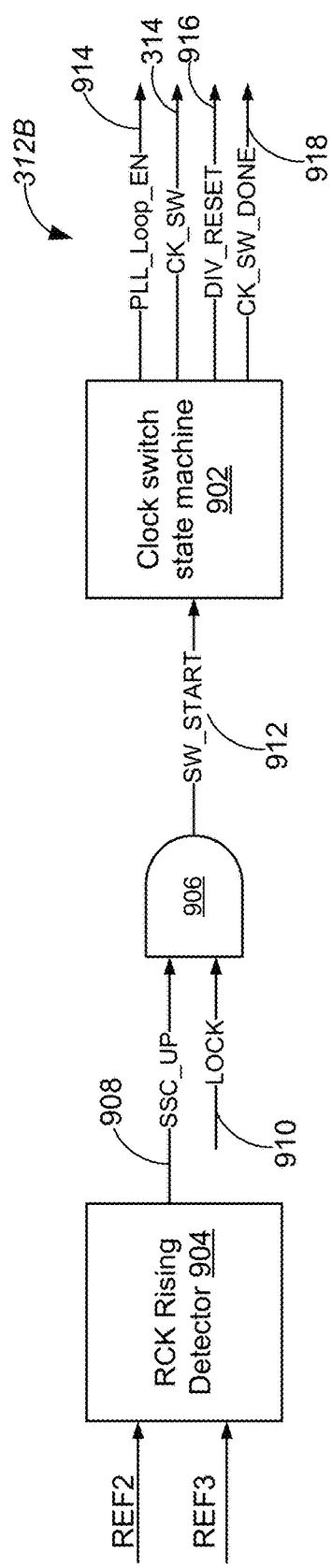
FIG. 9 is a block diagram of a controller that controls frequency switching based on a state machine, in accordance with some embodiments.
Figure 10:
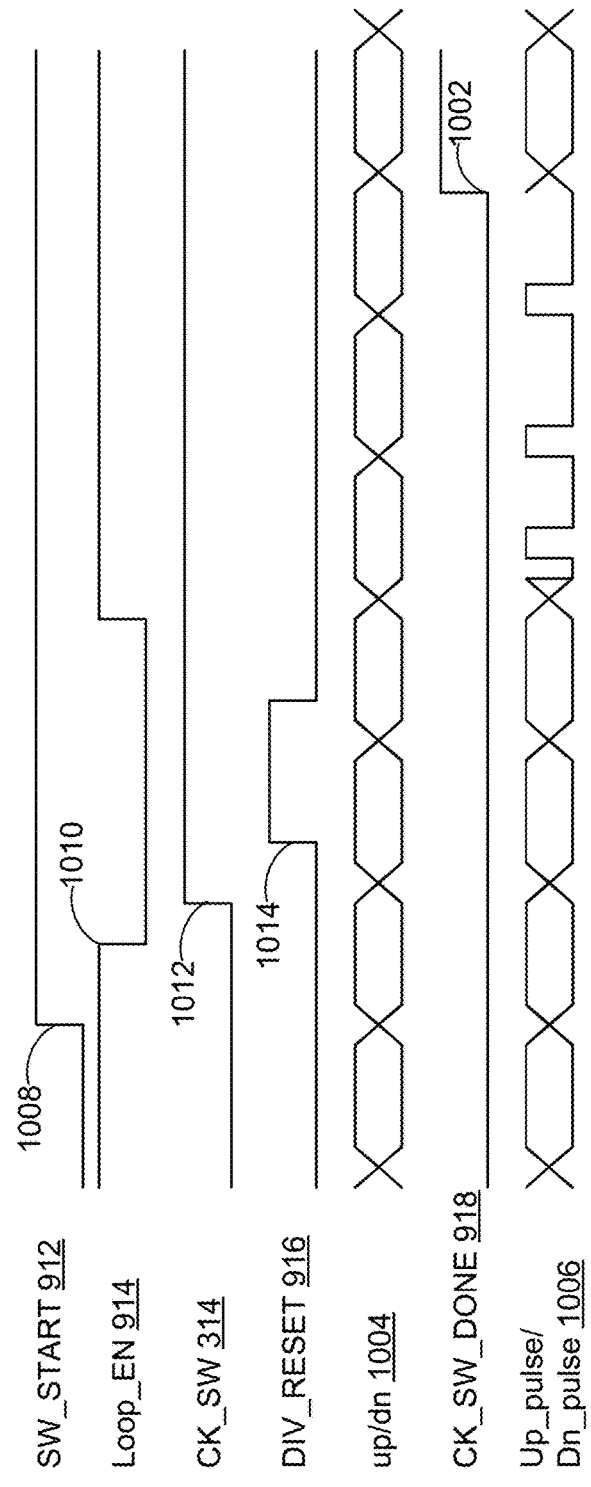
FIG. 10 illustrate signal levels of a plurality of example signals involved in frequency switching, in accordance with some embodiments.

FIG. 9 is a block diagram of a controller 312 that controls frequency switching based on a state machine 902, in accordance with some embodiments, and FIG. 10 illustrate signal levels of a plurality of example signals 1000 involved in frequency switching, in accordance with some embodiments. The controller 312 includes an RCK rising detector 904, a logic block 906, and the state machine 902. The RCK rising detector 904 is configured to track, and generate a frequency rising signal 908 indicating, whether a second frequency of the second reference signal REF2 increases, e.g., whether the second reference signal REF2 is in a frequency rising range, i.e., from the initial time $T_0$ to a peak frequency time $T_P$. In some embodiments, in a link training mode, the third reference signal REF3 includes a feedback clock 710 or reference clock 724 in FIG. 7. Both of the feedback clock 710 and reference clock 724 are derived from the periodic signal 336 that is substantially stable. A frequency difference of the second and third reference signals REF2 and REF3 is monitored to determine whether the second reference signal REF2 is in the frequency rising range from the initial time $T_0$ and peak frequency time $T_P$.

The logic block 906 (e.g., an AND logic) combines the frequency rising signal 908 and lock enable signal 910 to generate a switch enable 912. The switch enable 912 controls the state machine 902 to generate one or more of: a PLL loop enable 914, a lock signal CK_SW 314, a divider reset 916, and a lock complete 918. The PLL loop enable 914 is configured to control the PLL 700 to output the periodic signal 336. The lock signal CK_SW 314 is configured to control the selector 332 to select the first or second reference signal REF1 or REF2 as the input signal 338. The divider reset 916 is configured to control dividers used in the PLL 700. The lock complete 918 is configured to lock the second reference signal REF2 to be outputted as the input signal 338. After the lock complete 918 is enabled (1002), the second reference signal REF2 is optionally disabled to be outputted as the input signal 338. In some embodiments, only after the lock complete 918 is enabled, the link training mode is enabled, and the first reference signal REF1 is selected to as the input signal 338.

Referring to FIG. 10, the signals 1000 include the switch enable 912, PLL loop enable 914, lock signal CK_SW 314, divider reset 916, up and down controls 1004, lock complete 918, and up and down pulse signals 1006. The retimer 220 uses a frequency or phase difference detector 802 or 822 to compare the second reference signal REF2 modulated with spread-spectrum clocking and the third reference signal REF3 to generate the lock signal CK_SW 314. The second reference signal REF2 is down spreading. Logic blocks 904 and 906 are applied to determine whether the second reference signal REF2 is rising toward to a first frequency of the first reference signal REF1. The frequency rising signal 908 is high as the second reference signal REF2 is rising toward to the first frequency, and low as the second reference signal REF2 is dropping toward to the down-spreading frequency 602. The frequency rising signal 908 determines the switch enable 912. After the switch enable 912 is enabled (1008), the retimer 220 stops (1010) the PLL loop 700 and starts (1012) clock switching based on the lock signal CK_SW 314. One or more feedback dividers 718 and 720 are reset (1014) to minimize a phase difference during the course of generating the feedback clock 710. After reset release (1016), the retimer 220 re-shapes the up and down controls 1004, thereby reducing a PLL loop bandwidth at a pull-in period in which the input signal of the PLL is switched to reach the recovery clock, particularly for a skip cycle case. After certain delay or using an accurate frequency loss of lock check, the lock complete 918 is applied to make the PLL 700 to return to a normal bandwidth that is defined by the recovery clock to transmit data in the data transmission mode.

Figure 11:
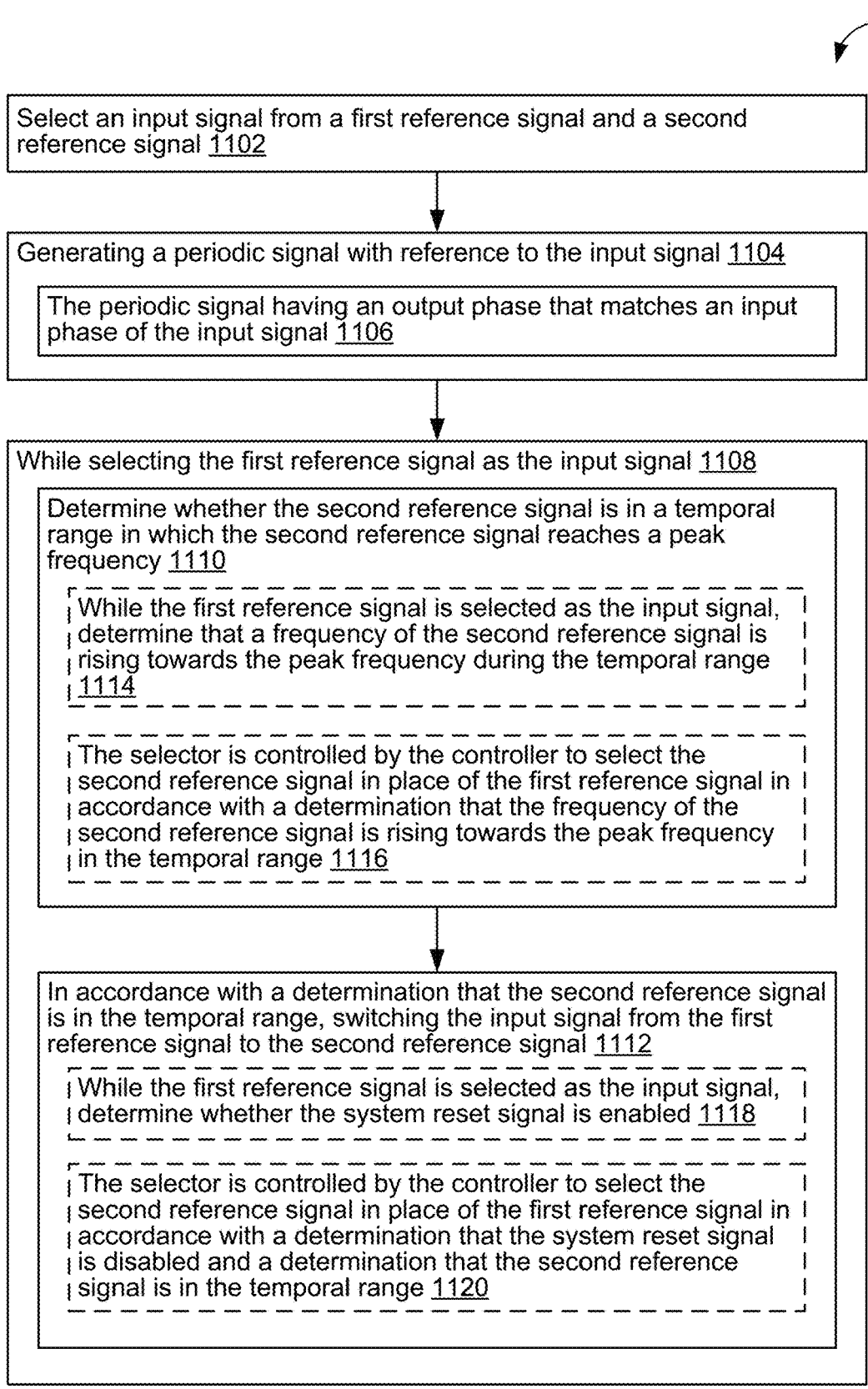
FIG. 11 is a flow diagram of an example method of controlling frequency in an electronic device (e.g., a data link, a data interface), in accordance with some embodiments.

FIG. 11 is a flow diagram of an example method 100 of controlling frequency in an electronic device (e.g., a data link, a data interface), in accordance with some embodiments. The electronic device includes a retimer 220. The electronic device selects (1102) an input signal 338 from a first reference signal REF1 and a second reference signal REF2, and generates (1104) a periodic signal 336 with reference to the input signal 338. The periodic signal 336 has (1106) an output phase that matches an input phase of the input signal 338. While selecting (1108) the first reference signal REF1 as the input signal 338, the electronic device determines (1110) whether the second reference signal REF2 is in a temporal range TR in which the second reference signal REF2 reaches a peak frequency $f_P$. In accordance with a determination that the second reference signal REF2 is in the temporal range TR, the electronic device switches (1112) the input signal 338 from the first reference signal REF1 to the second reference signal REF2.

In some embodiments, the electronic device determines whether the second reference signal REF2 is in the temporal range TR by while the first reference signal REF1 is selected as the input signal 338, determining (1114) that a frequency of the second reference signal REF2 is rising towards the peak frequency $f_P$ during the temporal range TR. The selector 332 is controlled by the controller 312 to select (1116) the second reference signal REF2 in place of the first reference signal REF1 in accordance with a determination that the frequency of the second reference signal REF2 is rising towards the peak frequency $f_P$ in the temporal range TR.

In some embodiments, the controller 312 is further configured to receive a system reset signal. While the first reference signal REF1 is selected as the input signal, the electronic device determines (1118) whether the system reset signal is enabled. The selector 332 is controlled (1120) by the controller 312 to select the second reference signal REF2 in place of the first reference signal REF1 in accordance with a determination that the system reset signal is disabled and a determination that the second reference signal REF2 is in the temporal range TR.

In some embodiments, the first reference signal REF1 has a first frequency that is substantially stable. The peak frequency $f_P$ is equal to the first frequency. Further, in some embodiments, the second reference signal REF2 has a second frequency that varies periodically between the peak frequency $f_P$ and a down-spreading frequency 602. Additionally, the second frequency of the second reference signal REF2 varies with a spreading frequency $f_{SPD}$ corresponding to a spreading period $T_{SPD}$. The controller 312 is configured to monitor an overshoot of an output frequency of the period signal and dynamically adjust the temporal range TR based on the overshoot 506 of the output frequency of the periodic signal 336. In an example, the output frequency of the periodic signal 336 is substantially equal to 20 GHz. The first frequency of the first reference signal REF1 is substantially equal to 25 MHz. The spreading frequency $f_{SPD}$ is substantially equal to 30 kHz. The second frequency of the second reference signal REF2 varies, periodically with the spreading frequency, between 25 MHz and 23.75 MHz. The temporal range TR is less than 0.5% of the spreading period $T_{SPD}$.

In some embodiments, the clock generator 334 further includes a PLL 700, and the PLL 700 further includes a PLL frequency or phase comparator 702, a loop filter 704, a VCO 706, and a feedback path 708. The PLL frequency or phase comparator 702 is configured to receive the input signal 338 and a feedback clock 710 and generate a PLL comparison signal 712. The loop filter 704 is coupled to the PLL frequency or phase comparator 702, and configured to generate a DC difference voltage 714 based on the PLL comparison signal 712. The VCO 706 is coupled to the loop filter 704, and configured to generate the periodic signal 336 based on the DC difference voltage 714. The feedback path 708 is coupled to the VCO 706 and PLL frequency or phase comparator 702, and configured to convert the periodic signal 336 to the feedback clock 710 and feed the feedback clock 710 to the PLL frequency or phase comparator 702.

Further, in some embodiments, the PLL further includes a charge pump circuit 722 coupled to the loop filter 704. The charge pump 722 is configured to control a variation rate of the DC difference voltage 714, such that in response to the input signal 338 being switched from the first reference signal REF1 to the second reference signal REF2. An overshoot 506 on an output frequency of the periodic signal 336 is less than a predefined portion of the periodic frequency.

Referring to FIG. 8A, in some embodiments, the controller 312 further includes a frequency or phase difference detector 802, an integrator 804, a comparator 806, and a lock latch 808. The frequency or phase difference detector 802 is configured to detect a frequency difference between the second reference signal REF2 and a third reference signal REF3. The integrator 804 is coupled to the frequency difference detector 802 and configured to generate a lock voltage that increases in response to detection of the frequency or phase difference of the second and third reference signals REF2 and REF3. The comparator 806 is coupled to the integrator 804, and configured to compare the lock voltage with a lock threshold associated with the temporal range TR. The lock latch 808 is coupled to the comparator, and configured to in accordance with a determination that the lock voltage 810 exceeds the lock threshold 812, enable a lock signal 314 for controlling the selector 332 to select the second reference signal REF2 as the input signal 338. In some embodiments, the clock generator 334 is further configured to divide the periodic signal 336 to generate the third reference signal REF2, and the controller 312 is configured to receive the third reference signal REF3 from the clock generator 334. In some embodiments, the controller 312 is configured to monitor an overshoot 506 of an output frequency of the periodic signal 336 and dynamically adjust the lock threshold 812 based on the overshoot 506 of the output frequency of the periodic signal 336.

Further, in some embodiments, the frequency or phase difference detector 802 includes a frequency difference detector configured to detect a frequency difference between the second and third frequency signals, and the integrator 804 includes an OR logic coupled to the frequency difference detector 802 to enable integration within the integrator 804. Alternatively, in some embodiments, the frequency or phase difference detector 802 includes a phase difference detector configured to detect a phase difference between the second and third frequency signals REF2 and REF3, and the integrator 804 includes an OR logic coupled to the frequency difference detector to enable integration within the integrator. It is noted that, in some embodiments, the integrator 804 includes an NAND logic used to implement the OR logic.

Referring to FIG. 8B, in some embodiments, the controller 312 further includes a frequency or phase difference detector 822, an integrator 824, a comparator 826, and a lock latch 828. The frequency or phase difference detector 822 is configured to detect a frequency or phase difference between the second reference signal REF2 and a third reference signal REF3. The integrator 824 is coupled to the frequency difference detector 822, and configured to generate a lock voltage 830 that decreases from a voltage rail in response to detection of the frequency or phase difference of the second and third reference signals REF2 and REF3. The comparator 826 is coupled to the integrator 824, and configured to compare the lock voltage 830 with a lock threshold 832 associated with the temporal range TR. The lock latch 828 is coupled to the comparator 826, and configured to in accordance with a determination that the lock voltage 830 drops below the lock threshold 832, enable a lock signal 314 for controlling the selector 332 to select the second reference signal REF2 as the input signal 338.

In some embodiments, in response to the input signal 338 being switched from the first reference signal REF1 to the second reference signal REF2, the periodic signal 336 has an overshoot 506 on an output frequency of the periodic signal 336, and the overshoot 506 is less than a predefined portion of the peak frequency $f_P$ (e.g., 1400 ppm, 300 ppm).

In some embodiments, the selector 332, clock generator 334, and controller 312 are integrated on a single substrate. In some embodiments, the selector 332, clock generator 334, and controller 331 are formed on two or three substrates and integrated in a single semiconductor package.

In some embodiments, the electronic device further includes a data link 120 having a retimer 220. The retimer 220 includes a transmitter portion (e.g., FIR driver 310), a receiver portion, the selector 332, the clock generator 334, and the controller 312. The retimer 220 is configured to operate at a link training mode and a data transmission mode, reconfigure the receiver or transmitter portion based on the periodic signal 336 that is generated from the first reference signal REF1 during the training mode, and communicate data in synchronization with the periodic signal 336 that is generated from the second reference signal REF2 during the data transmission mode.

It should be understood that the particular order in which the operations in each of FIGS. 1-10 have been described are merely exemplary and are not intended to indicate that the described order is the only order in which the operations could be performed. One of ordinary skill in the art would recognize various ways to controlling frequency in a data link 120 including a retimer 220 as described herein.

Figure 12:
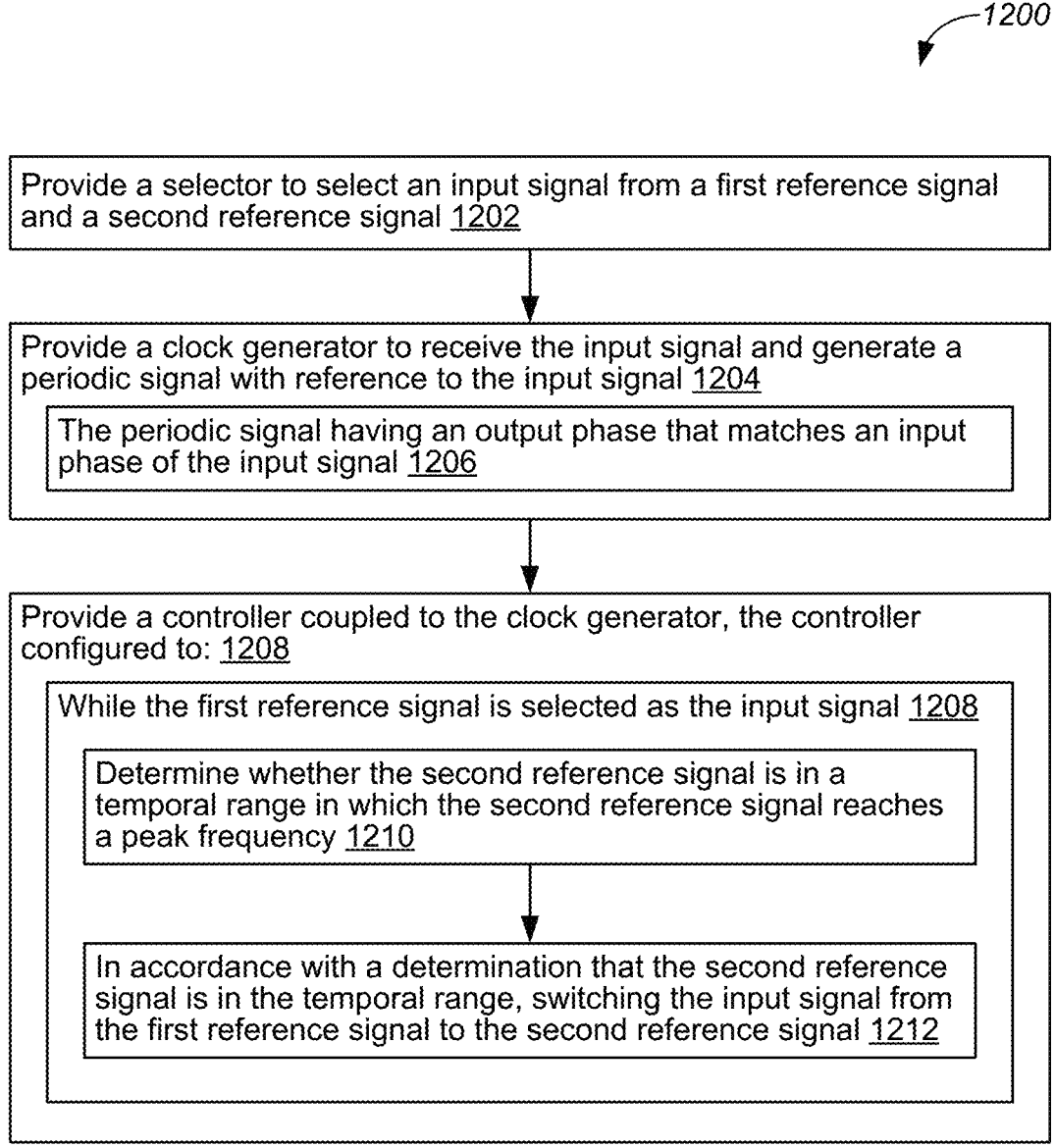
FIG. 12 is a flow diagram of an example method of providing an electronic device (e.g., a data link, a data interface) for frequency controlling, in accordance with some embodiments.

FIG. 12 is a flow diagram of an example method 1200 of providing an electronic device (e.g., a data link, a data interface) for frequency controlling, in accordance with some embodiments. The electronic device includes a retimer 220. A selector is provided (1202) to select an input signal 338 from a first reference signal REF1 and a second reference signal REF2. A clock generator 334 is provided (1204) to receive the input signal 338 and generate a periodic signal 336 with reference to the input signal 338. The periodic signal 336 has (1206) an output phase that matches an input phase of the input signal 338. A controller 312 is provided (1208) to be coupled to the clock generator 334. The controller 312 is configured to, while the first reference signal REF1 is selected as the input signal 338, determine (1210) whether the second reference signal REF2 is in a temporal range TR in which the second reference signal REF2 reaches a peak frequency $f_P$. The controller 312 is configured to in accordance with a determination that the second reference signal REF2 is in the temporal range TR, switch (1212) the input signal 338 from the first reference signal REF1 to the second reference signal REF2.

In some embodiments, the clock generator 334 is provided by providing a PLL 700 including a PLL frequency or phase comparator 702, a loop filter 704, a VCO 706, and a feedback path 708. The PLL frequency or phase comparator 702 is provided to receive the input signal 338 and a feedback clock 710 and generate a PLL comparison signal 712. The loop filter 704 is provided to be coupled to the PLL frequency or phase comparator 702 and generate a DC difference voltage 714 based on the PLL comparison signal 712. The VCO 706 is provided to be coupled to the loop filter 704 and generate the periodic signal 336 based on the DC difference voltage 714. The feedback path 708 is provided to be coupled to the VCO 706 and PLL frequency or phase comparator 702, convert the periodic signal 336 to the feedback clock 710, and feed the feedback clock 710 to the PLL frequency or phase comparator 702.

Further, in some embodiments, a charge pump circuit 722 is provided to be coupled to the loop filter 704 and control a variation rate of the DC difference voltage 714, such that in response to the input signal 338 being switched from the first reference signal REF1 to the second reference signal REF2. An overshoot 506 on an output frequency of the periodic signal 336 is less than a predefined portion of the output frequency.

In some embodiments, the controller 312 further includes a frequency or phase difference detector 802, an integrator 804, a comparator 806, and a lock latch 808. The frequency or phase difference detector 802 is provided to detect a frequency or phase difference between the second reference signal REF2 and a third reference signal REF3. The integrator 804 is provided to be coupled to the frequency difference detector 802 and generate a lock voltage 810 that increases in response to detection of the frequency or phase difference of the second and third reference signals REF2 and REF3. The comparator 806 is provided to be coupled to the integrator 804 and compare the lock voltage 810 with a lock threshold 812 associated with the temporal range TR. The lock latch 808 is provided to be coupled to the comparator 806 and, in accordance with a determination that the lock voltage 810 exceeds the lock threshold 812, enable a lock signal 314 for controlling the selector 332 to select the second reference signal REF2 as the input signal 338.

In some embodiments, the controller 312 further includes a frequency or phase difference detector 822, an integrator 824, a comparator 826, and a lock latch 828. The frequency or phase difference detector 822 is provided to detect a frequency or phase difference between the second reference signal REF2 and a third reference signal REF3. The integrator 824 is provided to be coupled to the frequency difference detector 822 and generate a lock voltage 830 that decreases from a voltage rail in response to detection of the frequency or phase difference of the second and third reference signals REF2 and REF3. The comparator 826 is provided to be coupled to the integrator 824 and compare the lock voltage 830 with a lock threshold 832 associated with the temporal range TR. The lock latch 828 is provided to be coupled to the comparator 826 and, in accordance with a determination that the lock voltage 830 drops below the lock threshold 832, enable a lock signal 314 for controlling the selector 332 to select the second reference signal REF2 as the input signal 338.

In some embodiments, a single substrate is provided to integrate the selector 332, clock generator 334, and controller 331. In some embodiments, a single semiconductor package is provided to integrate two or three substrates where the selector 332, clock generator 334, and controller 331 are formed.

In some embodiments, a data link 120 having a retimer 220 is provided to include a transmitter portion (e.g., FIR driver 310), a receiver portion, the selector 332, the clock generator 334, and the controller 312. The retimer 220 is provided to operate at a link training mode and a data transmission mode, reconfigure the receiver or transmitter portion based on the periodic signal 336 that is generated from the first reference signal REF1 during the training mode, and communicate data in synchronization with the periodic signal 336 that is generated from the second reference signal REF2 during the data transmission mode.

It should be understood that the particular order in which the operations in each of FIGS. 1-11 have been described are merely exemplary and are not intended to indicate that the described order is the only order in which the operations could be performed. One of ordinary skill in the art would recognize various ways to providing an electronic device for frequency controlling as described herein.

It will also be understood that, although the terms first, second, etc. are, in some instances, used herein to describe various elements, these elements should not be limited by these terms. These terms are only used to distinguish one element from another. For example, a first electronic device can be termed a second electronic device, and, similarly, a second electronic device can be termed a first electronic device, without departing from the scope of the various described embodiments. The first electronic device and the second electronic device are both electronic device, but they are not the same electronic device.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof.

The above description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An electronic device, comprising:
   a selector configured to select one of a first reference signal and a second reference signal as an input signal having an input phase;
   a clock generator coupled to the selector, the clock generator being configured to receive the input signal and generate a periodic signal with reference to the input signal, the periodic signal having an output phase that matches the input phase of the input signal; and
   a controller coupled to the selector, the controller configured to, while the first reference signal is selected as the input signal:
      determine, within a cycle of the second reference signal, whether the second reference signal is in a predetermined temporal range in which the second reference signal reaches a peak frequency, wherein the temporal range is less than a period of the second reference signal; and
      in accordance with a determination that the second reference signal is in the temporal range, control the selector to select the second reference signal as the input signal.

2. The electronic device of claim 1, wherein determining whether the second reference signal is in the temporal range further comprises:
   while the first reference signal is selected as the input signal, determining that a frequency of the second reference signal is rising towards the peak frequency during the temporal range, wherein the selector is controlled by the controller to select the second reference signal in place of the first reference signal in accordance with a determination that the frequency of the second reference signal is rising towards the peak frequency in the temporal range.

3. The electronic device of claim 1, wherein the controller is further configured to:
   receive a system reset signal; and
   while the first reference signal is selected as the input signal, determine whether the system reset signal is enabled, wherein the selector is controlled by the controller to select the second reference signal in place of the first reference signal in accordance with a determination that the system reset signal is disabled and a determination that the second reference signal is in the temporal range.

4. The electronic device of claim 1, wherein:
   the first reference signal has a first frequency that is substantially stable; and
   the peak frequency is equal to the first frequency.

5. The electronic device of claim 4, wherein the second reference signal has a second frequency that varies periodically between the peak frequency and a down-spreading frequency.

6. The electronic device of claim 5, wherein:
   the period of the second reference signal is a spreading period;
   the second frequency of the second reference signal varies with a spreading frequency corresponding to the spreading period; and
   the controller is configured to:
      monitor an overshoot of an output frequency of the periodic signal; and
      dynamically adjust the temporal range based on the overshoot of the output frequency of the periodic signal.

7. The electronic device of claim 6, wherein:
   the output frequency of the periodic signal is substantially equal to 20 GHz;
   the first frequency of the first reference signal is substantially equal to 25 MHz;
   the spreading frequency is substantially equal to 1.25 MHz;
   the second frequency of the second reference signal varies, periodically with the spreading frequency, between 25 MHz and 23.75 MHz; and
   the temporal range is less than 0.5% of the spreading period.

8. The electronic device of claim 1, wherein the clock generator further comprises a phase lock loop (PLL), the PLL further comprising:
   a PLL frequency or phase comparator configured to receive the input signal and a feedback clock and generate a PLL comparison signal;
   a loop filter coupled to the PLL frequency or phase comparator, the PLL configured to generate a DC difference voltage based on the PLL comparison signal;
   a voltage controlled oscillator (VCO) coupled to the loop filter, the VCO configured to generate the periodic signal based on the DC difference voltage; and
   a feedback path coupled to the VCO and PLL frequency or phase comparator, the feedback path configured to convert the periodic signal to the feedback clock and feed the feedback clock to the PLL frequency or phase comparator.

9. The electronic device of claim 8, wherein the PLL further comprises:
a charge pump circuit coupled to the loop filter, the charge pump circuit configured to control a variation rate of the DC difference voltage, such that in response to the input signal being switched from the first reference signal to the second reference signal, an overshoot on an output frequency of the periodic signal is less than a predefined portion of the output frequency.

10. The electronic device of claim 1, wherein the controller further comprises:
a frequency or phase difference detector configured to detect a frequency or phase difference between the second reference signal and a third reference signal;
an integrator coupled to the frequency or phase difference detector, the integrator being configured to generate a lock voltage that increases in response to detection of the frequency or phase difference of the second and third reference signals;
a comparator coupled to the integrator, the comparator being configured to compare the lock voltage with a lock threshold associated with the temporal range; and
a lock latch coupled to the comparator, the lock latch being configured to, in accordance with a determination that the lock voltage exceeds the lock threshold, enable a lock signal for controlling the selector to select the second reference signal as the input signal.

11. The electronic device of claim 10, wherein the frequency or phase difference detector includes a frequency difference detector configured to detect a frequency difference between the second and third reference signals, and the integrator includes an OR logic coupled to the frequency difference detector to enable integration within the integrator.

12. The electronic device of claim 10, wherein the frequency or phase difference detector includes the phase difference detector configured to detect a phase difference between the second and third reference signals, and the integrator includes an OR logic coupled to the phase difference detector to enable integration within the integrator.

13. The electronic device of claim 10, wherein the clock generator is further configured to divide the periodic signal to generate the third reference signal, and the controller is configured to receive the third reference signal from the clock generator.

14. The electronic device of claim 10, wherein the controller is configured to:
monitor an overshoot of an output frequency of the periodic signal; and
dynamically adjust the lock threshold based on the overshoot of the output frequency of the periodic signal.

15. The electronic device of claim 1, wherein the controller further comprises:
a frequency or phase difference detector configured to detect a frequency or phase difference between the second reference signal and a third reference signal;
an integrator coupled to the frequency difference detector, the integrator being configured to generate a lock voltage that decreases from a voltage rail in response to detection of the frequency or phase difference of the second and third reference signals;
a comparator coupled to the integrator, the comparator being configured to compare the lock voltage with a lock threshold associated with the temporal range; and
a lock latch coupled to the comparator, the lock latch being configured to, in accordance with a determination that the lock voltage drops below the lock threshold, enable a lock signal for controlling the selector to select the second reference signal as the input signal.

16. The electronic device of claim 1, wherein in response to the input signal being switched from the first reference signal to the second reference signal, the periodic signal has an overshoot on an output frequency of the periodic signal, and the overshoot is less than a predefined portion of the peak frequency.

17. The electronic device of claim 1, wherein the selector, clock generator, and controller are integrated on a single substrate.

18. The electronic device of claim 1, further comprising a data link having a retimer, wherein the retimer includes a transmitter portion, a receiver portion, the selector, the clock generator, and the controller, and is configured to:
operate at a link training mode and a data transmission mode;
reconfigure the receiver or transmitter portion based on the periodic signal that is generated from the first reference signal in the link training mode; and
communicate data in synchronization with the periodic signal that is generated from the second reference signal in the data transmission mode.

19. A clock generation method, comprising:
selecting an input signal from a first reference signal and a second reference signal;
generating a periodic signal with reference to the input signal, the periodic signal having an output phase that matches an input phase of the input signal; and
while selecting the first reference signal as the input signal:
determining, within a cycle of the second reference signal, whether the second reference signal is in a predetermined temporal range in which the second reference signal reaches a peak frequency, wherein the temporal range is less than a period of the second reference signal; and
in accordance with a determination that the second reference signal is in the temporal range, switching the input signal from the first reference signal to the second reference signal.

20. A method, comprising:
providing a selector to select an input signal from a first reference signal and a second reference signal;
providing a clock generator configured to receive the input signal and generate a periodic signal with reference to the input signal, the periodic signal having an output phase that matches an input phase of the input signal; and
providing a controller coupled to the clock generator, the controller configured to, while the first reference signal is selected as the input signal:
determine, within a cycle of the second reference signal, whether the second reference signal is in a predetermined temporal range in which the second reference signal reaches a peak frequency, wherein the temporal range is less than a period of the second reference signal; and
in accordance with a determination that the second reference signal is in the temporal range, switch the input signal from the first reference signal to the second reference signal.

* * * * *